US012740244B2

(12) United States Patent
Roh

(10) Patent No.: US 12,740,244 B2
(45) Date of Patent: Sep. 15, 2026

(54) DISPLAY DEVICE WITH iCVD BUFFER LAYER IN BANK TRENCH

(71) Applicant: LG Display Co., Ltd., Yeongdeungpo-gu (KR)

(72) Inventor: ByeongGyu Roh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 964 days.

(21) Appl. No.: 17/957,858

(22) Filed: Sep. 30, 2022

(65) Prior Publication Data

US 2023/0157084 A1 May 18, 2023

(30) Foreign Application Priority Data

Nov. 17, 2021 (KR) ........................ 10-2021-0158288

(51) Int. Cl.
*H01L 27/32* (2006.01)
*H01L 51/52* (2006.01)
*H10K 50/844* (2023.01)
*H10K 59/122* (2023.01)

(52) U.S. Cl.
CPC ......... *H10K 59/122* (2023.02); *H10K 50/844* (2023.02)

(58) Field of Classification Search
CPC ........................... H10K 59/122; H10K 50/844
See application file for complete search history.

(56) References Cited

U.S. PATENT DOCUMENTS 9,755,188 B2 9/2017 Choi et al.
10,553,652 B2 2/2020 Kim et al.
10,804,348 B2 10/2020 Kim
2013/0040102 A1* 2/2013 Gleason .................. B05D 7/52 428/141
2016/0072101 A1* 3/2016 Choi .................. H10K 50/858 257/40
2016/0156066 A1* 6/2016 Gleason ........... H01M 10/0525 429/317
2016/0197292 A1 7/2016 Lee et al.
2018/0061907 A1* 3/2018 Kim .................... H10K 59/124
2018/0301521 A1 10/2018 Yang (Continued)

FOREIGN PATENT DOCUMENTS

CN 101197285 A 6/2008
CN 106876331 A 6/2017

(Continued)

*Primary Examiner* — Peter Bradford

(74) *Attorney, Agent, or Firm* — Seed Intellectual Property Law Group LLP

(57) ABSTRACT

A display device according to an example embodiment of the present disclosure includes a substrate having a plurality of sub-pixels defined thereon, a bank disposed between the plurality of sub-pixels, at least one trench pattern disposed between the plurality of sub-pixels and from which a thickness of an upper surface of the bank is partially removed, a buffer layer on the bank, the buffer layer being deposited to cover an inner surface of the trench pattern by an initiated chemical vapor deposition (iCVD) method and an encapsulation layer disposed on the buffer layer. Therefore, it is possible to improve reliability by preventing film formation defects of the encapsulation layer in the trench, and to improve display quality by preventing display quality defects such as light and dark spots and bright spots.

24 Claims, 19 Drawing Sheets

(56) References Cited

U.S. PATENT DOCUMENTS

| | | | | |
|---|---|---|---|---|
| 2019/0006431 | A1 | 1/2019 | Won et al. | |
| 2019/0181205 | A1* | 6/2019 | Kim | H10K 59/124 |
| 2020/0235172 | A1 | 7/2020 | Lee et al. | |
| 2021/0043705 | A1 | 2/2021 | Lim et al. | |
| 2021/0079142 | A1* | 3/2021 | Im | B05D 1/60 |
| 2021/0231943 | A1 | 7/2021 | Bellman et al. | |
| 2021/0351248 | A1 | 11/2021 | Lee et al. | |

FOREIGN PATENT DOCUMENTS

| | | | | | |
|---|---|---|---|---|---|
| CN | 107799555 | A | | 3/2018 | |
| CN | 109216577 | A | | 1/2019 | |
| CN | 109216580 | A | | 1/2019 | |
| CN | 109950277 | A | | 6/2019 | |
| CN | 110515197 | A | | 11/2019 | |
| CN | 111029294 | A | * | 4/2020 | H01L 21/76237 |
| CN | 115084024 | A | | 9/2022 | |
| EP | 3496177 | A1 | | 6/2019 | |
| JP | 2016528071 | A | | 9/2016 | |
| JP | 2016222840 | A | | 12/2016 | |
| JP | 2018045873 | A | | 3/2018 | |
| KR | 2015-0037702 | A | | 4/2015 | |
| KR | 2017-0003768 | A | | 1/2017 | |
| KR | 20180003965 | A | | 1/2018 | |
| KR | 2019-0067968 | A | | 6/2019 | |
| KR | 20190070424 | A | | 6/2019 | |
| KR | 20210017179 | A | | 2/2021 | |
| KR | 20210019675 | A | * | 2/2021 | G02B 27/01 |
| KR | 2021-0032035 | A | | 3/2021 | |
| TW | 201523953 | A | | 6/2015 | |
| WO | WO-2018130288 | A1 | * | 7/2018 | B32B 15/095 |
| WO | WO-2023081751 | A1 | * | 5/2023 | B05D 1/60 |

* cited by examiner

| | MATERIAL NAME | | | FLOW RATE (sccm) | | | TEMPERATURE (°C) | | | | | | PRESSURE [mTorr] |
|---|---|---|---|---|---|---|---|---|---|---|---|---|---|
| | INITIATOR | MONOMER 1 | MONOMER 2 | INITIATOR | MONOMER 1 | MONOMER 2 | INITIATOR | MONOMER 1 | MONOMER 2 | FILAMENT | STAGE | CHAMBER | |
| #1 | TBPO | GMA | HEA | 30 | 45 | 28 | 30 | 30 | 45 | 140 | 30 | 70 | 200 |
| #2 | TBPO | GMA | HEA | 30 | 56 | 28 | 30 | 30 | 45 | 140 | 30 | 70 | 200 |
| #3 | TBPO | GMA | HEA | 30 | 84 | 28 | 30 | 30 | 45 | 140 | 30 | 70 | 200 |
| #4 | TBPO | GMA | HEA | 30 | 112 | 28 | 30 | 30 | 45 | 140 | 30 | 70 | 200 |

FIG. 6

DISPLAY DEVICE WITH iCVD BUFFER LAYER IN BANK TRENCH

CROSS-REFERENCE TO RELATED APPLICATIONS

This application claims the benefit of and priority to Korean Patent Application No. 10-2021-0158288 filed on Nov. 17, 2021, in the Republic of Korea, the entire contents of which are hereby expressly incorporated by reference into the present application.

BACKGROUND

Technical Field

The present disclosure relates to a display device, and more particularly, to a display device capable of reducing color mixing of light emitted from a plurality of light emitting elements.

Description of the Related Art

Recently, as our society advances toward an information-oriented society, the field of display devices for visually expressing an electrical information signal has rapidly advanced. Various display devices having excellent performance in terms of thinness, lightness, and low power consumption, are being developed correspondingly.

Among these various display devices, an organic light emitting display device is a self-light emitting display device, and can be manufactured to be light and thin since it does not require a separate light source, unlike a liquid crystal display device having a separate light source. In addition, the organic light emitting display device has advantages in terms of power consumption due to a low voltage driving, and is excellent in terms of a color implementation, a response speed, a viewing angle, and a contrast ratio (CR). Therefore, organic light emitting display devices have been applied as the next generation displays.

BRIEF SUMMARY

An aspect of the present disclosure is to provide a display device to which a multi-stack structure using stacking of a plurality of light emitting units (or light emitting structures) is applied in order to realize improved efficiency and lifespan characteristics.

Another aspect of the present disclosure is to provide a display device capable of minimizing leakage current when a display device having a multi-stack structure is driven by applying a trench structure.

Still another aspect of the present disclosure is to provide a display device having improved reliability and improved display quality by preventing a film formation defect of an encapsulation layer in a trench.

Technical benefits of the present disclosure are not limited to the above-mentioned benefits, and other benefits, which are not mentioned above, can be clearly understood by those skilled in the art from the following descriptions.

A display device according to an example embodiment of the present disclosure may include a substrate having a plurality of sub-pixels defined thereon, a bank disposed between the plurality of sub-pixels, at least one trench pattern disposed between the plurality of sub-pixels and from which a thickness of an upper surface of the bank is partially removed, a buffer layer on the bank, the buffer layer being deposited to cover an inner surface of the trench pattern by an initiated chemical vapor deposition (iCVD) method and an encapsulation layer disposed on the buffer layer.

A display device according to another example embodiment of the present disclosure may include a substrate having a plurality of sub-pixels defined thereon, a bank disposed between the plurality of sub-pixels, at least one trench pattern disposed between the plurality of sub-pixels and from which a thickness of an upper surface of the bank is partially removed, at least one spacer disposed on the bank between the plurality of sub-pixels, a buffer layer deposited on an inner surface of the trench pattern and the bank and the spacer along an inner shape of the trench pattern and a bending of the spacer by an iCVD method and an encapsulation layer disposed on the buffer layer.

Other detailed matters of the example embodiments are included in the detailed description and the drawings.

According to the present disclosure, by applying a light emitting element having a multi-stack structure, high efficiency can be exhibited and a low current driving is allowed, so that a lifespan of the light emitting element can be improved.

According to the present disclosure, leakage of current through a common layer of a plurality of light emitting elements can be improved by applying a trench structure.

According to the present disclosure, it is possible to improve reliability by preventing film formation defects of an encapsulation layer in a trench, and to improve display quality by preventing display quality defects such as light and dark spots and bright spots.

According to the present disclosure, a structure in which organic layers are disconnected can be stably secured, so that a yield and processability can be improved.

The effects according to the present disclosure are not limited to the contents exemplified above, and more various effects are included in the present specification.

BRIEF DESCRIPTION OF THE SEVERAL VIEWS OF THE DRAWINGS

FIG. 6 is a table showing process conditions of iCVD buffer layers.

DETAILED DESCRIPTION

Figure 1:
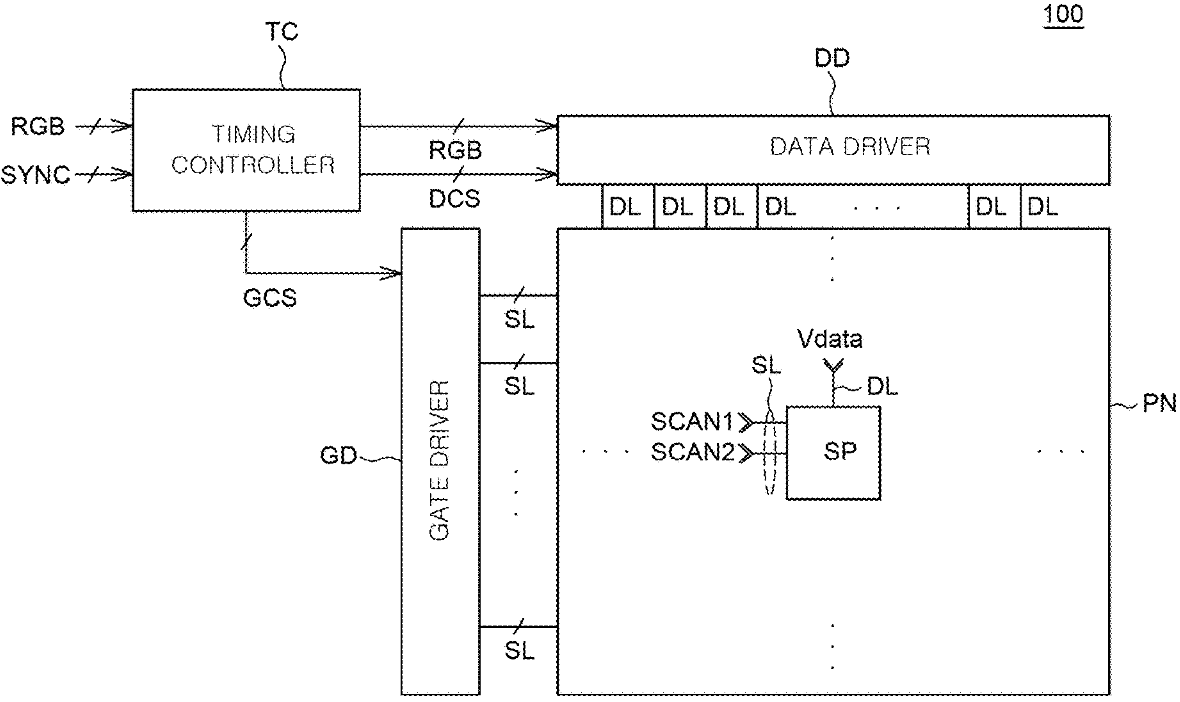
FIG. 1 is a schematic configuration diagram of a display device according to a first example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, example embodiments of the present disclosure will be described in detail with reference to accompanying drawings.

FIG. 1 is a schematic configuration diagram of a display device according to a first example embodiment of the present disclosure.

Referring to FIG. 1, a display device 100 may include a display panel PN including a plurality of sub-pixels SP, a gate driver GD and a data driver DD for supplying various signals to the display panel PN, and a timing controller TC for controlling the gate driver GD and the data driver DD.

The gate driver GD may supply a plurality of scan signals to a plurality of scan lines SL according to a plurality of gate control signals GCS provided from the timing controller TC. The plurality of scan signals may include a first scan signal SCAN1 and a second scan signal SCAN2.

The data driver DD may convert image data RGB input from the timing controller TC into a data signal Vdata using a reference gamma voltage according to a plurality of data control signals DCS provided from the timing controller TC. In addition, the data driver DD may supply the converted data signal Vdata to a plurality of data lines DL.

The timing controller TC aligns image data RGB input from the outside and supplies it to the data driver DD, and may generate a gate control signal GCS and a data control signal DCS using synchronization signals SYNC input from the outside.

Figure 2:
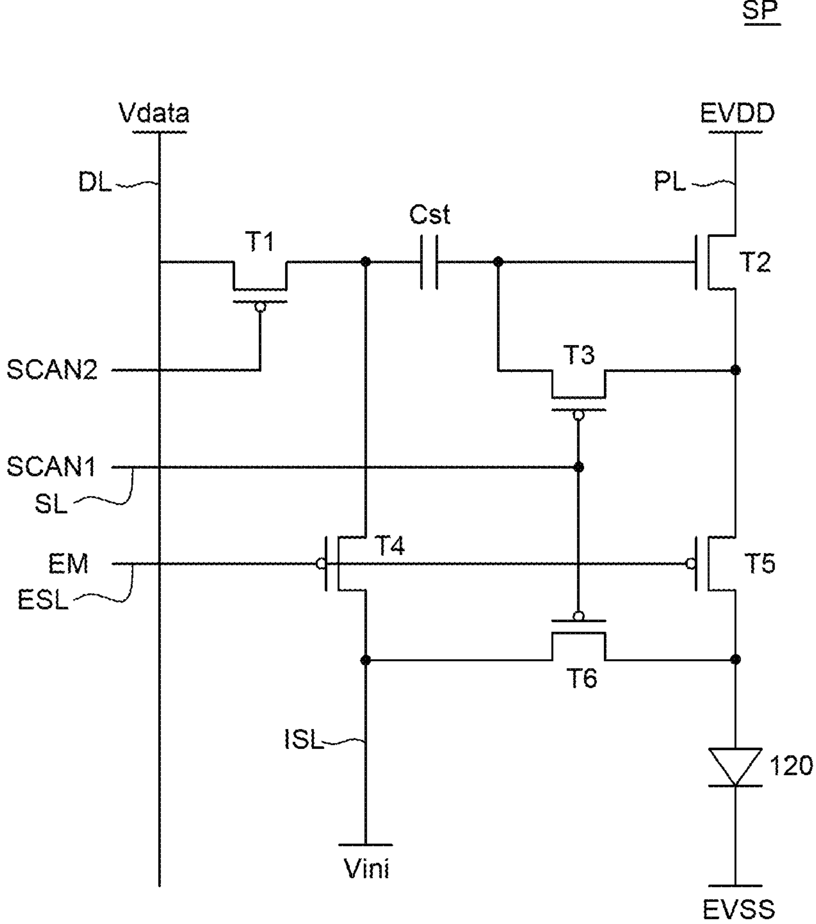
FIG. 2 is a circuit diagram of a sub-pixel of the display device of FIG. 1.

FIG. 2 is a circuit diagram of a sub-pixel of the display device of FIG. 1.

Referring to FIG. 2, a pixel circuit of each of the plurality of sub-pixels SP may include first to sixth transistors T1, T2, T3, T4, T5, and T6 and a capacitor Cst.

The first transistor T1 may be connected to a second scan line and be controlled by the second scan signal SCAN2 supplied through the second scan line. The first transistor T1 may be electrically connected between the data line supplying the data signal Vdata and the capacitor Cst.

The second transistor T2 may be electrically connected between a high potential power line to which a high potential power signal EVDD is supplied and the fifth transistor T5. In addition, a gate electrode of the second transistor T2 may be electrically connected to the capacitor Cst.

The third transistor T3 may be controlled by the first scan signal SCAN1 supplied through a first scan line and may compensate for a threshold voltage of the second transistor T2, and the third transistor T3 may be referred to as a compensation transistor.

The fourth transistor T4 may be electrically connected to an initialization signal line to which an initialization signal Vini is supplied, and the capacitor Cst. In addition, the fourth transistor T4 may be controlled by an emission control signal EM which is supplied through an emission control signal line.

In addition, the fifth transistor T5 is electrically connected between the second transistor T2 and a light emitting element 120 and may be controlled by the emission control signal EM which is supplied through the emission control signal line.

The sixth transistor T6 is electrically connected between the initialization signal line to which the initialization signal Vini is supplied and an anode of the light emitting element 120, and may be controlled by the first scan signal SCAN1 supplied through the first scan line.

In the above description, although a case in which the pixel circuit of each of the plurality of sub-pixels SP includes the first to sixth transistors T1, T2, T3, T4, T5, and T6 and the capacitor Cst is described as an example, the present disclosure is not limited thereto.

Hereinafter, a pixel structure of the display device 100 according to the first example embodiment of the present disclosure will be described in more detail with reference to FIGS. 3 to 5.

Figure 3:
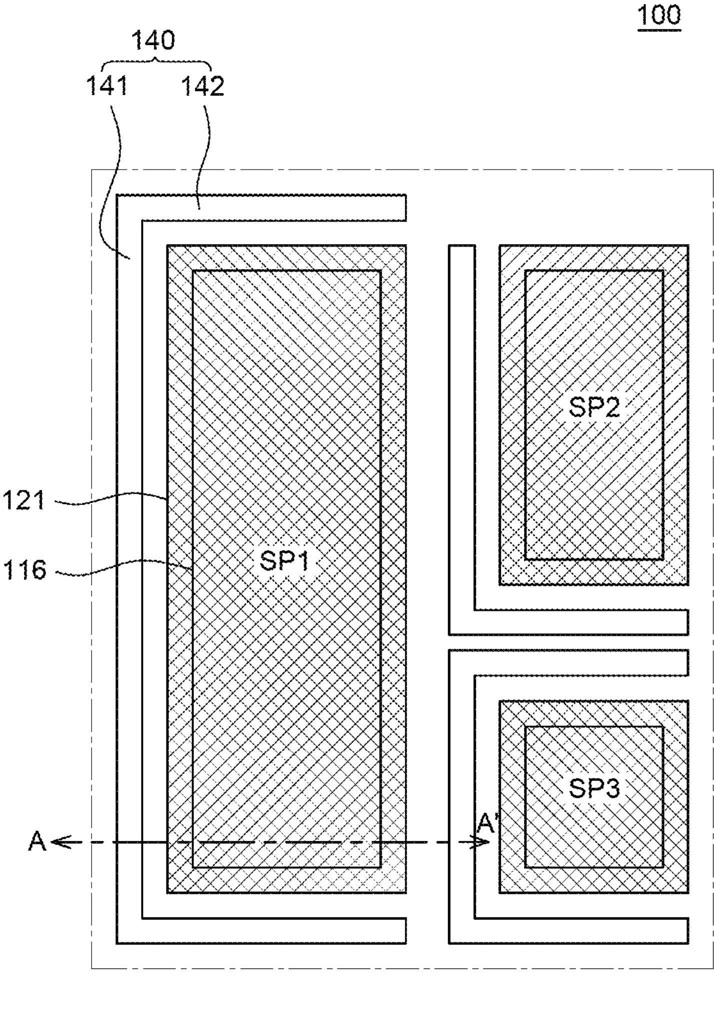
FIG. 3 is a plan view illustrating one pixel structure of the display device of FIG. 1.

FIG. 3 is a plan view illustrating one pixel structure of the display device of FIG. 1.

Figure 4:
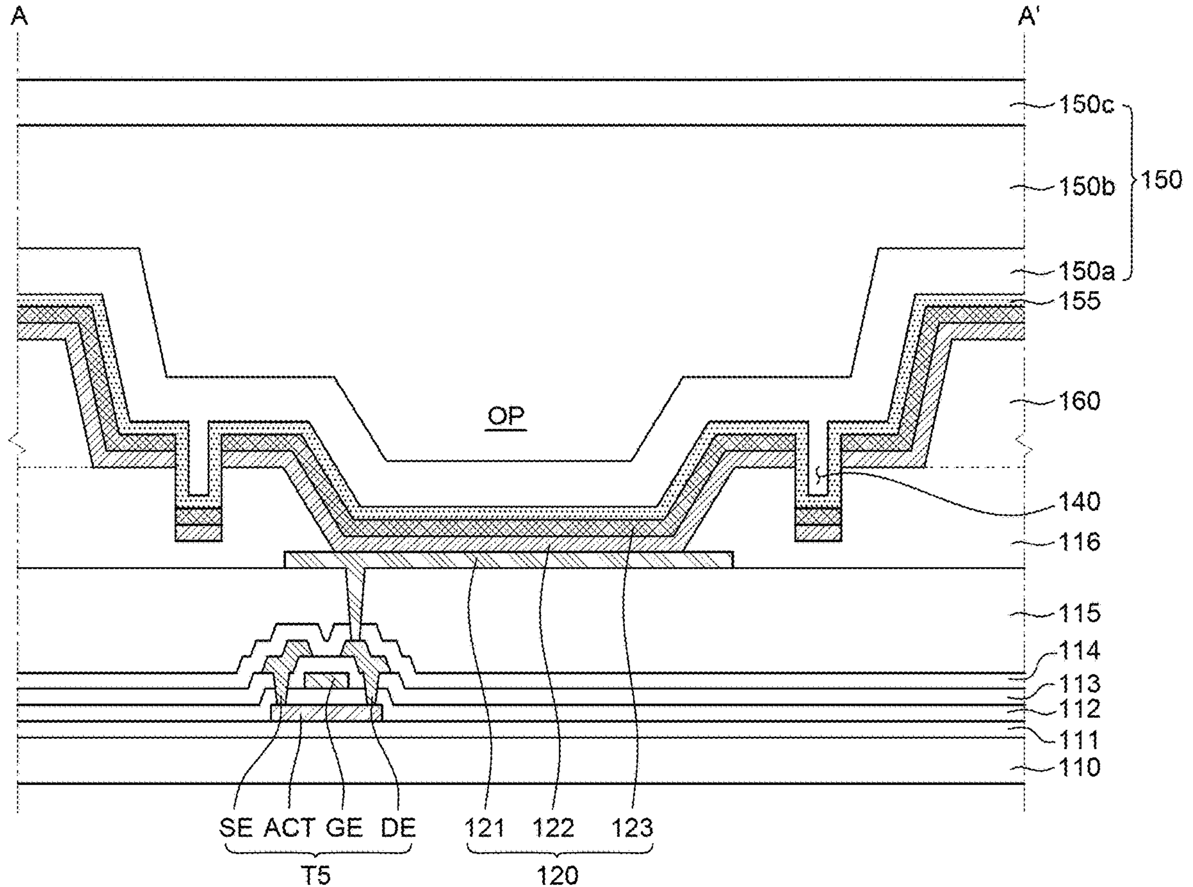
FIG. 4 is a cross-sectional view taken along line A-A' of FIG. 3.

FIG. 4 is a cross-sectional view taken along line A-A' of FIG. 3.

Figure 5:
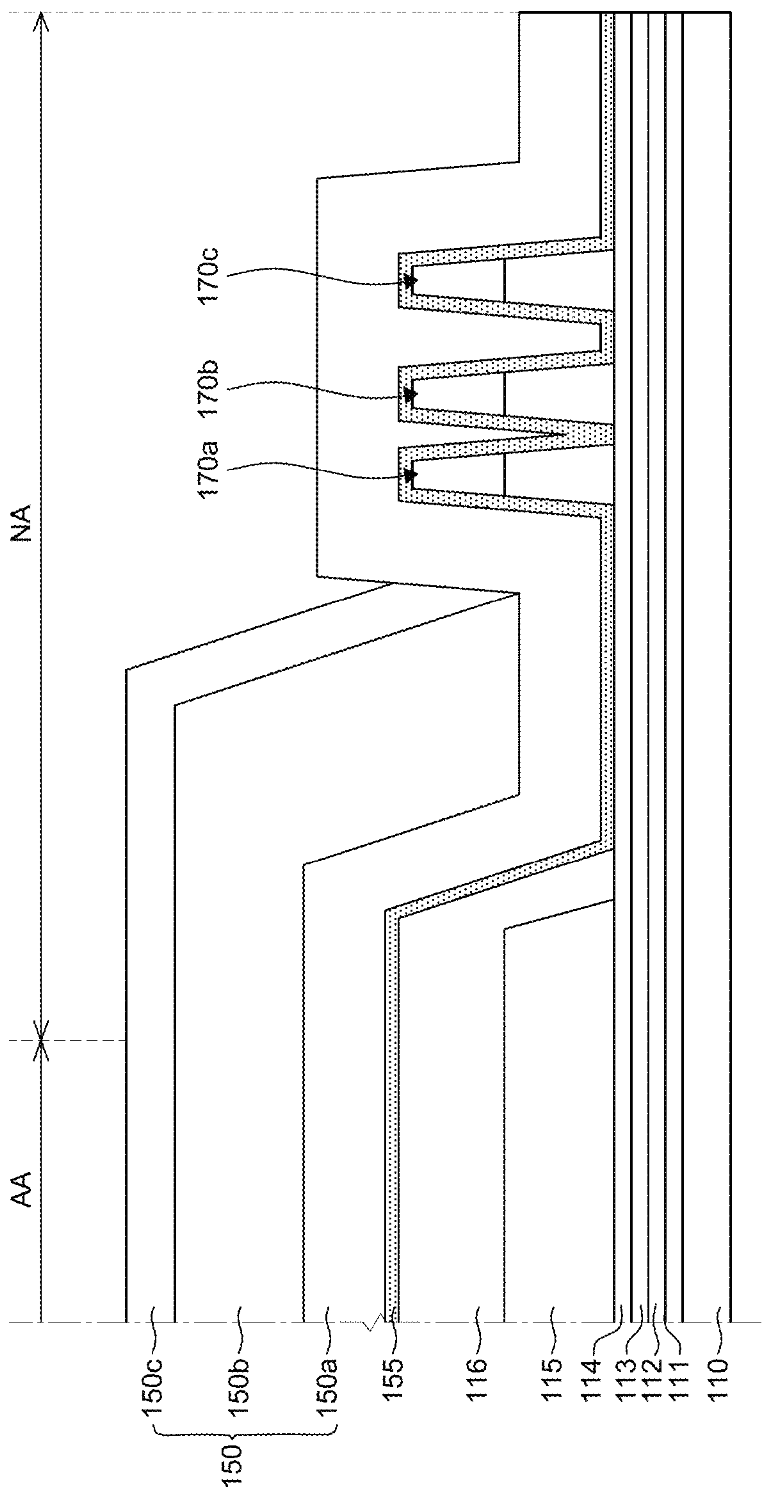
FIG. 5 is a cross-sectional view illustrating an outer portion of the display device of FIG. 1.

FIG. 5 is a cross-sectional view illustrating an outer portion of the display device of FIG. 4 shows a cross-section of one sub-pixel in the pixel structure of FIG. 3 as an example.

Referring to FIGS. 3 to 5, the display device 100 according to the first example embodiment of the present disclosure may include a substrate 110, a buffer layer 111, a gate insulating layer 112, an interlayer insulating layer 113, a passivation layer 114, a planarization layer 115, banks 116, high potential power lines, scan lines, data lines, initialization signal lines, emission control signal lines, the fifth transistor T5, the light emitting elements 120, spacers 160, a buffer layer 155, and an encapsulation layer 150.

In FIG. 3, for convenience of explanation, only the bank 116 and an anode 121 among components of the light emitting element 120 are shown. The bank 116 may be disposed in a remaining area except for areas that are exposed by an opening OP and trench patterns 140. Also, in FIG. 4, only the fifth transistor T5 among a plurality of the transistors T1, T2, T3, T4, T5, and T6 and the capacitor Cst of the pixel circuit of the sub-pixel SP is illustrated for convenience of explanation.

Referring to FIG. 3, the plurality of sub-pixels SP are individual units that emit light, and the light emitting element 120 is disposed in each of the plurality of sub-pixels SP. The plurality of sub-pixels SP may include first sub-pixels SP1, second sub-pixels SP2, and third sub-pixels SP3 that emit light of different colors. For example, the first sub-pixel SP1 may be a blue sub-pixel, the second sub-pixel SP2 may be a green sub-pixel, and the third sub-pixel SP3 may be a red sub-pixel. However, the present disclosure is not limited thereto.

A plurality of the first sub-pixels SP1 may be disposed in a plurality of columns. That is, the plurality of first sub-pixels SP1 may be disposed in the same column. In addition, a plurality of the second sub-pixels SP2 and a plurality of the third sub-pixels SP3 may be disposed between the plurality of respective columns in which the plurality of first sub-pixels SP1 are disposed. For example, the plurality of first sub-pixels SP1 may be disposed in one column, and the second sub-pixels SP2 and the third sub-pixels SP3 may be disposed together in a column adjacent thereto. In addition, the plurality of second sub-pixels SP2 and the plurality of third sub-pixels SP3 may be alternately disposed in the same column. However, the present disclosure is not limited thereto.

In addition, although it is described that the plurality of sub-pixels SP include the first sub-pixels SP1, the second sub-pixels SP2, and the third sub-pixels SP3, the arrangement, number, and color combination of the plurality of sub-pixels SP may be variously changed according to design, and are not limited thereto.

Referring to FIGS. 2 to 5, high potential power lines PL that extend in a column direction may be disposed between the plurality of sub-pixels SP. A plurality of the high potential power lines PL are lines that transmit the high potential power signal EVDD to each of the plurality of sub-pixels SP. Each of the plurality of high potential power lines PL may be disposed between the first sub-pixel SP1 and the second sub-pixel SP2 and between the first sub-pixel SP1 and the third sub-pixel SP3. However, the present disclosure is not limited thereto.

A plurality of data lines DL that extend in the same column direction as the plurality of high potential power lines PL may be disposed. The plurality of data lines DL are lines that transmit the data signal Vdata to each of the plurality of sub-pixels SP. For example, each of the plurality of data lines DL may be disposed between the second sub-pixel SP2 and the high potential power line PL and between the third sub-pixel SP3 and the high potential power line PL. However, the present disclosure is not limited thereto, and the plurality of data lines DL may be disposed between the plurality of high potential power lines PL and the first sub-pixels SP1.

In addition, the plurality of scan lines SL that extend in a row direction may be disposed. The plurality of scan lines SL are lines that transmit scan signals SCAN1 and SCAN2 to each of the plurality of sub-pixels SP. The plurality of scan lines SL may include first scan lines and second scan lines. The first scan line may be disposed to extend in the row direction between the second sub-pixel SP2 and the third sub-pixel SP3, and the second scan line may cross the third sub-pixel SP3 and be disposed to extend in the row direction.

In addition, a plurality of initialization signal lines ISL that extend in the row direction in the same manner as the plurality of scan lines SL may be disposed between the plurality of sub-pixels SP. The plurality of initialization signal lines ISL are lines that transmit the initialization signal Vini to each of the plurality of sub-pixels SP. Each of the plurality of initialization signal lines ISL may be disposed between the second sub-pixel SP2 and the third sub-pixel SP3. The plurality of initialization signal lines ISL may be disposed between the first scan lines SL1 and the second scan lines SL2. However, the present disclosure is not limited thereto.

A plurality of emission control signal lines EL that extend in the row direction in the same manner as the plurality of scan lines SL may be disposed. The plurality of emission control signal lines EL are lines that transmit the emission control signal EM to each of the plurality of sub-pixels SP. The plurality of emission control signal lines EL may be disposed to be adjacent to the plurality of second scan lines. In addition, the plurality of emission control signal lines EL may be disposed to cross the third sub-pixels SP3 and extend in the row direction. The second scan lines SL2 may be disposed between the plurality of emission control signal lines EL and the plurality of initialization signal lines ISL.

The plurality of lines may be classified into direct current (DC) lines that transmit a DC signal and alternating current (AC) lines that transmit an AC signal. Among the plurality of lines, the high potential power line PL and the initialization signal line ISL that transmit the high potential power signal EVDD or the initialization signal Vini, which is a DC signal, may be included in the DC lines. Also, among the plurality of lines, the scan line SL and the data line DL that transmit the scan signals SCAN1 and SCAN2 and the data signal Vdata, which are AC signals, may be included in the AC lines.

A plurality of the spacers 160 may be disposed between the plurality of sub-pixels SP. When the light emitting elements 120 are formed in the plurality of sub-pixels SP, a fine metal mask (FMM), which is a deposition mask, may be used. In this case, the plurality of spacers 160 may be disposed to prevent damage that may be caused by contact with the deposition mask and to maintain a constant distance between the deposition mask and the substrate 110.

Also, a plurality of the trench patterns 140 may be disposed between the plurality of sub-pixels SP. The plurality of trench patterns 140 may be formed by partially removing a thickness of an upper portion of the bank 116, but the present disclosure is not limited thereto, and the plurality of trench patterns 140 may be formed by removing an entire thickness of the bank 116. FIG. 4 illustrates a case in which, for example, one trench pattern 140 is disposed between the plurality of sub-pixels SP, but the present disclosure is not limited thereto.

A portion of organic layers 122 and cathodes 123 between the sub-pixels SP adjacent to each other may be disconnected by the trench pattern 140. In FIG. 3, for example, a case where the trench pattern 140 is divided into a plurality of portions in a form in which they surround the sub-pixel SP is illustrated, but the present disclosure is not limited thereto.

For example, the plurality of trench patterns 140 may include first portions 141 and second portions 142. The first portion 141 is a portion extending in the column direction between the plurality of sub-pixels SP. The first portion 141 may be a portion extending in the column direction between the first sub-pixel SP1 and the second sub-pixel SP2 or between the first sub-pixel SP1 and the third sub-pixel SP3. The first portion 141 may be divided into a plurality of portions in the column direction, but is not limited thereto. When the first portion 141 is divided into a plurality of portions, resistance of the cathode 123 may be lowered, and a difference in luminance caused by a voltage drop phenomenon may be reduced.

At least a portion of the first portion 141 may be disposed between the DC line and the AC line extending in the column direction among the lines. For example, the first portion 141 may extend in the column direction, and have at least a portion thereof that is disposed between the high potential power line PL and the data line DL. However, the present disclosure is not limited thereto, and at least a portion of the first portion 141 may overlap the high potential power line PL or the data line DL.

The second portion 142 is a portion extending in the row direction between the plurality of sub-pixels SP. The second portion 142 may be a portion extending in the row direction between the first sub-pixel SP1 and the first sub-pixel SP1. In this case, the second portion 142 may extend in the row direction from the first portion 141 or may be disposed separately from the first portion 141. At least a portion of the second portion 142 may overlap the DC line or the AC line extending in the row direction among the lines. Meanwhile, the second portion 142 may also be disposed between the second sub-pixel SP2 and the third sub-pixel SP3.

Such a trench pattern 140 can minimize a lateral leakage current generated in a multi-stack structure, which will be described in more detail with reference to FIGS. 4 and 5.

Referring to FIGS. 3 to 5, the substrate 110 is a support member for supporting other components of the display device, and may be formed of an insulating material.

For example, the substrate 110 may be formed of glass or resin or the like. In addition, the substrate 110 may be formed of a polymer or plastic such as polyimide (PI), or may be formed of a material having flexibility.

The substrate 110 may be divided into an active area AA and a non-active area NA.

The active area AA is an area in which an image is displayed.

The plurality of sub-pixels SP constituting a plurality of pixels and circuits for driving the plurality of sub-pixels SP may be disposed in the active area AA. The plurality of sub-pixels SP are minimum units constituting the active area AA, and a display element may be disposed in each of the plurality of sub-pixels SP, and the plurality of sub-pixels SP may constitute the pixel. For example, the light emitting element 120 including the anode 121, the organic layer 122, and the cathode 123 may be disposed in each of the sub-pixels SP, but is not limited thereto. In addition, the circuit for driving the plurality of sub-pixels SP may include a driving element, lines and the like. For example, the circuit may be formed to include the thin film transistor T5, a storage capacitor, a gate line, a data line, and the like, but is not limited thereto.

The non-active area NA is an area in which an image is not displayed.

Various lines and circuits for driving the light emitting element 120 of the active area AA may be disposed in the non-active area NA. Although not illustrated, for example, in the non-active area NA, driver ICs such as a gate driver IC and a data driver IC or link lines for transmitting signals to the sub-pixels SP and circuits of the active area AA may be disposed, but are not limited thereto.

The buffer layer 111 may be disposed on the substrate 110. The buffer layer 111 may reduce penetration of moisture or impurities through the substrate 110. The buffer layer 111 may be formed of, for example, a single layer or multilayers of silicon oxide (SiOx) or silicon nitride (SiNx), but is not limited thereto. However, the buffer layer 111 may be omitted according to a type of the substrate 110 or a type of the transistor, but is not limited thereto.

The fifth transistor T5 may be disposed on the buffer layer 111.

The fifth transistor T5 may include an active layer ACT, a gate electrode GE, a source electrode SE, and a drain electrode DE.

The active layer ACT may be formed of a semiconductor material such as an oxide semiconductor, amorphous silicon, or polysilicon, but is not limited thereto. For example, when the active layer ACT is formed of an oxide semiconductor, the active layer ACT may be formed of a channel region, a source region, and a drain region, and the source region and the drain region may be conductive regions, but are not limited thereto.

The gate insulating layer 112 may be disposed on the active layer ACT.

The gate insulating layer 112 is an insulating layer for insulating the active layer ACT and the gate electrode GE, and may be formed of a single layer or multilayers of silicon oxide (SiOx) or silicon nitride (SiNx), but is limited thereto.

The gate electrode GE may be disposed on the gate insulating layer 112.

The gate electrode GE may be formed of a conductive material, for example, copper (Cu), aluminum (Al), molybdenum (Mo), nickel (Ni), titanium (Ti), chromium (Cr), or an alloy thereof, but is not limited thereto.

The interlayer insulating layer 113 may be disposed on the gate electrode GE.

Contact holes for connecting the source electrode SE and the drain electrode DE respectively to the active layer ACT may be formed in the interlayer insulating layer 113. The interlayer insulating layer 113 may be formed of a single layer or multilayers of silicon oxide (SiOx) or silicon nitride (SiNx), but is not limited thereto.

The source electrode SE and the drain electrode DE are disposed on the interlayer insulating layer 113. The source electrode SE and the drain electrode DE that are disposed to be spaced apart from each other may be electrically connected to the active layer ACT. The source electrode SE and the drain electrode DE may be formed of a conductive material, for example, copper (Cu), aluminum (Al), molybdenum (Mo), nickel (Ni), titanium (Ti), chromium (Cr), or an alloy thereof, but are not limited thereto.

The high potential power line and the data line may be disposed on the interlayer insulating layer 113. The high potential power line and the data line may be disposed on the same layer and formed of the same conductive material as the source electrode SE and the drain electrode DE, but are not limited thereto. For example, the high potential power line and the data line may be formed of a conductive material, for example, copper (Cu), aluminum (Al), molybdenum (Mo), nickel (Ni), titanium (Ti), chromium (Cr), or an alloy thereof, but are not limited thereto.

The passivation layer 114 may be disposed on the high potential power line, the data line, the source electrode SE, and the drain electrode DE. The passivation layer 114 is an insulating layer for protecting components under the passivation layer 114. For example, the passivation layer 114 may be formed of a single layer or multilayers of silicon oxide (SiOx) or silicon nitride (SiNx), but is not limited thereto. Also, the passivation layer 114 may be omitted according to embodiments.

The planarization layer 115 may be disposed on the passivation layer 114. The planarization layer 115 is an insulating layer that planarizes an upper portion of the substrate 110. The planarization layer 115 may be formed of an organic material, for example, may be formed of a single layer or multilayers of polyimide or photo acryl, but is not limited thereto.

A plurality of the light emitting elements 120 may be disposed in the plurality of respective sub-pixels SP on the planarization layer 115. The light emitting element 120 may include the anode 121, the organic layer 122, and the cathode 123. Meanwhile, the organic layer 122 may be composed of an emission layer disposed in an emission area and a common layer disposed on an entire surface of the substrate 110 including the emission area, but is not limited thereto.

The anode 121 may be disposed on the planarization layer 115.

The anode 121 may be electrically connected to the fourth transistor and receive a driving current of the pixel circuit. Since the anode 121 supplies holes to the emission layer, it may be formed of a conductive material having a high work function. The anode 121 may be formed of, for example, a transparent conductive material such as indium tin oxide (ITO) or indium zinc oxide (IZO), but is not limited thereto.

Meanwhile, the display device 100 may be implemented as a top emission type or a bottom emission type. In the case of the top emission type, a reflective layer formed of a metallic material having excellent reflection efficiency, for example, a material such as aluminum (Al) or silver (Ag), may be added under the anode 121 so that light emitted from the emission layer is reflected by the anode 121 and is directed upwardly, that is, toward the cathode 123. On the other hand, when the display device 100 is the bottom emission type, the anode 121 may be formed of only a transparent conductive material. Hereinafter, it is assumed that the display device 100 according to the first example embodiment of the present disclosure is the top emission type.

Meanwhile, at least one trench pattern 140 may be disposed between the plurality of sub-pixels SP.

The trench pattern 140 may be formed in the bank 116. That is, the trench pattern 140 may be formed by partially removing the thickness of the upper portion of the bank 116. At this time, although not shown, an undercut structure may be formed in at least one side of an inner portion of the trench pattern 140.

As described above, the light emitting element 120 of the present disclosure may include the anode 121, the organic layer 122, and the cathode 123.

The organic layer 122 may be disposed between the anode 121 and the cathode 123.

The organic layer 122 is an area in which light is emitted by combination of electrons and holes supplied from the anode 121 and the cathode 123.

The organic layer 122 according to the first example embodiment of the present disclosure may include an emission layer disposed in each of the plurality of sub-pixels SP and a common layer disposed in common in the plurality of sub-pixels SP, but is not limited thereto.

That is, in order to improve quality and productivity of an organic light emitting display device, various structures for improvements in efficiency and lifespan and a reduction in power consumption of the light emitting element have been proposed.

Accordingly, as well as a light emitting element structure to which one stack, that is, one light emitting unit is applied, light emitting elements having a tandem structure in which a plurality of stacks, that is, stacking of a plurality of light emitting units is used to realize improved efficiency and lifespan characteristics, have been suggested.

In such a light emitting element of the tandem structure, that is, a two-stack structure using stacking of a first light emitting unit and a second light emitting unit, an emission area where light is emitted by recombination of electrons and holes is positioned in each of the first light emitting unit and the second light emitting unit, and light emitted from a first emission layer of the first light emitting unit and light emitted from a second emission layer of the second light emitting unit may respectively cause constructive interference, so that the light emitting element of the two-stack structure may provide high luminance as compared to a light emitting element of a single stack structure.

In addition, a distance between a plurality of sub-pixels constituting one pixel in light emitting elements decrease as an organic light emitting display device is higher in resolution. Auxiliary organic layers such as a hole injection layer EIL, a hole transport layer HTL, a charge generation layer CGL, an electron injection layer EIL, an electron transport layer ETL, and the like, except for emission layers are deposited to correspond to all of the plurality of sub-pixels using a common mask and are formed as common layers, and the emission layers in the plurality of sub-pixels that respectively generate light of different wavelengths may be individually deposited and formed to correspond to the respective sub-pixels using a fine metal mask.

In the case of the light emitting element as described above, when a voltage is applied between an anode and a cathode, a lateral leakage current is generated in a lateral direction of the light emitting element through the common layer formed in the light emitting element. Accordingly, a color mixing defect occurs as not only sub-pixels where light emission is required, but also sub-pixels where light emission is unwanted, which are located adjacent thereto emit light.

Such color mixing defect may be more severe in the light emitting element of the two-stack structure using the staking of the first light emitting unit and the second light emitting unit which uses constructive interference of light, as compared to the light emitting element of the single stack structure.

Accordingly, the present disclosure is characterized in that as shown in FIGS. 3 and 4, the plurality of trench patterns 140 are formed between the plurality of sub-pixels SP to thereby disconnect a portion of the common layer and the cathode 123 between the sub-pixels SP adjacent to each other, so that a leakage current is minimized when the display device of the multi-stack structure is driven.

Referring back to FIGS. 3 to 5, the bank 116 may be disposed on the anode 121 and the planarization layer 115. The bank 116 is an insulating layer disposed between the plurality of sub-pixels SP to separate the plurality of sub-pixels SP.

The bank 116 may include an opening OP exposing a portion of the anode 121. The bank 116 may be an organic insulating material that is disposed to cover an edge or an end portion of the anode 121. For example, the bank 116 may be formed of polyimide, acryl, or benzocyclobutene (BCB)-based resin, but is not limited thereto.

At least one spacer 160 may be disposed on the bank 116. The spacer 160 may be disposed on the bank 116 to maintain a predetermined distance from a deposition mask when the light emitting element 120 is formed. That is, due to the spacer 160, the bank 116 and the anode 121 under the spacer 160 and the deposition mask, may maintain a predetermined distance from the deposition mask, and damage due to contact therebetween may be prevented. The spacer 130 may be formed in a shape in which a width thereof is narrower upwardly, for example, a tapered shape, so as to minimize an area in contact with the deposition mask.

The organic layer 122 may be disposed on the anode 121 and the bank 116. In this case, the organic layer 122 is formed on a bottom of the trench pattern 140 but is not formed on a side surface thereof, so that a portion of the organic layer 122 between the adjacent sub-pixels SP may be disconnected by the trench pattern 140.

The organic layer 122 may include an emission layer disposed in each of the plurality of sub-pixels SP and a common layer disposed in common in the plurality of sub-pixels SP. The emission layer is an organic layer for emitting light of a specific color, and different emission layers may be disposed in each of the first sub-pixel SP1, the second sub-pixel SP2, and the third sub-pixel SP3. However, the present disclosure is not limited thereto, and a plurality of emission layers may be provided in each of all the sub-pixels SP to emit white light.

The common layer is an organic layer disposed to improve luminous efficiency of the emission layer. The common layer may be formed as one layer throughout the plurality of sub-pixels SP. That is, the common layers of the plurality of respective sub-pixels SP may be connected to each other and formed integrally. In this case, the common layer may include a hole injection layer, a hole transport layer, an electron transport layer, an electron injection layer, a charge generation layer, and the like, but is not limited thereto.

The cathode 123 may be disposed on the organic layer 122.

Since the cathode 123 supplies electrons to the organic layer 122, it may be formed of a conductive material having a low work function. The cathode 123 may be formed as one layer throughout the plurality of sub-pixels SP. That is, the cathodes 123 of the plurality of respective sub-pixels SP may be connected to each other and formed integrally. In this case, the cathode 123 may be formed of, for example, a transparent conductive material such as indium tin oxide (ITO) or indium zinc oxide (IZO) or an ytterbium (Yb) alloy and may further include a metal doped layer, but is not limited thereto. Meanwhile, although not shown in the drawings, the cathode 123 may be electrically connected to the low potential power line and receive a low potential power signal.

Meanwhile, as described above, the common layer of the plurality of light emitting elements 120 may be formed as one layer over an entirety of the plurality of sub-pixels SP. As the light emitting elements 120 of the plurality of sub-pixels SP are formed in a structure in which they share the common layer, when the light emitting element 120 of a specific sub-pixel SP emits light, a phenomenon in which a current flows to the light emitting elements 120 of adjacent sub-pixels SP, that is, a current leakage phenomenon may occur. The current leakage phenomenon may cause the light emitting element 120 of another sub-pixel SP that is not intended, to emit light, which may cause color mixing between the plurality of sub-pixels SP and increase power consumption. In addition, color abnormality and irregular color may be visually recognized due to a leakage current, and thus, display quality may be degraded. For example, when only the first sub-pixel SP1 among the plurality of sub-pixels SP emits light, a portion of a current which is supplied to drive the light emitting element 120 of the first sub-pixel SP1 may leak to the second sub-pixel SP2 and/or the third sub-pixel SP3 adjacent thereto through the common layer.

Accordingly, in the display device 100 according to the first example embodiment of the present disclosure, a leakage current through the common layer of the light emitting elements 120 can be minimized by disposing the trench patterns 140 between the plurality of sub-pixels SP. First, since the plurality of trench patterns 140 are formed between the plurality of sub-pixels SP, and the common layer and the cathode 123 are deposited along the plurality of trench patterns 140, a length of a path through which leakage current flows can increase. Since the common layer serving as the path of the leakage current is formed along the plurality of trench patterns 140 and the bank 116, the length of the common layer may be increased than an existing case, and the length of the path of the leakage current may be increased. Accordingly, by increasing the length of the path through which the leakage current flows, resistance may be increased and the leakage current flowing to the light emitting elements 120 of adjacent sub-pixels SP 120 can be reduced.

In addition, in the display device 100 according to the first example embodiment of the present disclosure, at least a portion of the common layer and the cathode 123 between the adjacent sub-pixels SP may be disconnected by the trench pattern 140. Accordingly, leakage current flowing to the adjacent sub-pixel SP may be minimized.

Meanwhile, the buffer layer 111, the gate insulating layer 112, the interlayer insulating layer 113, and the passivation layer 114 may be formed to extend to the non-active area NA in an outer portion of the display device 100.

In addition, the planarization layer 115 and the bank 116 may be formed thereon up to a portion of the non-active area NA.

The bank 116 may be formed to cover the planarization layer 115, but is not limited thereto.

Although not shown, a capping layer formed of an organic material such as a polymer or the like may be formed on the substrate 110 on which the cathode 123 is formed. However, the present disclosure is not limited thereto, and the capping layer may not be formed if necessary.

The capping layer may be formed of an organic material or an inorganic material, and since the capping layer is formed by a thermal evaporation method, the capping layer is relatively thin and may be disconnected at least partially between the adjacent sub-pixels SP by the trench pattern 140. For example, the capping layer may have a thickness of about 0.1 μm.

In the case of a top emission type, the capping layer has a specific refractive index, so it can serve to collect light to improve light emission, and in the case of a bottom emission type, it serves as a buffer for the cathode 123 of the light emitting element 120.

The capping layer may serve as one optical control layer. The capping layer may increase reflectivity at an interface between the capping layer and the outside by controlling a difference in refractive index with the outside. Through this increase in reflectivity, the capping layer may implement a micro-cavity effect at a specific wavelength. In this case, the capping layer may be formed to have a different thickness for each of the sub-pixels SP1, SP2, and SP3.

A buffer layer 155 according to the present disclosure is formed on the capping layer, and the encapsulation layer 150 composed of multiple layers may be formed thereon.

For reference, devices using organic materials, including light emitting devices, are very vulnerable to atmospheric gases, particularly moisture or oxygen, and have poor durability against heat, so a thorough encapsulation process is required therefor.

If an appropriate encapsulation process is not followed, a device lifespan is rapidly reduced, and dark spots are formed in the device, which may lead to product defects. Conversely, when an appropriate encapsulation process is applied in a device manufacturing process, device reliability can be secured and high-quality devices can be produced.

In general, such encapsulation processes are largely divided into two methods.

One method is a cover method in which a moisture absorbent (getter) is attached to a cover of glass or metal and then, the cover is attached to a device using an adhesive having low water permeability. The other method is a thin film method in which several types of films are laminated and attached to a light emitting device, or a film is deposited directly on the light emitting device.

Among them, materials having excellent oxygen barrier properties and water vapor barrier properties are mainly used for the film used in the thin film method, and chemical vapor deposition (CVD), plasma enhanced chemical vapor deposition (PECVD), atomic layer deposition (ALD) or the like may be used for deposition.

Specifically describing the encapsulation layer 150, a capping layer is formed on an upper surface of the substrate 110 on which the light emitting element 120 is formed, and a primary protective layer 150*a*, an organic layer 150*b*, and a secondary protective layer 150*c* are sequentially formed to constitute the encapsulation layer 150 serving as an encapsulation means. However, the number of inorganic layers and organic layers constituting the encapsulation layer 150 is not limited thereto.

In the case of the primary protective layer 150*a*, since it is formed of an inorganic insulating layer, stack coverage thereof is not good due to a lower step. However, since the organic layer 150*b* serves to perform planarization, the secondary protective layer 150*c* is not affected by a step due to underlying layers. In addition, since a thickness of the organic layer 150*b* formed of a polymer is sufficiently thick, cracks caused by foreign materials can be compensated.

On a front surface of the substrate 110 including the secondary protective layer 150*c*, a protective film of multiple layers may be positioned to face it for encapsulation, and an adhesive which is transparent and has adhesive properties may be interposed between the encapsulation layer 150 and the protective film.

A polarizing plate for preventing reflection of light incident from the outside may be attached onto the protective film, but is not limited thereto.

Meanwhile, in the case of the first example embodiment of the present disclosure, the organic layer 150*b* may be formed by an inkjet method. Accordingly, a plurality of dam portions 170*a*, 170*b*, and 170*c* may be provided in the non-active area NA in the outer portion to control a flow of the organic layer 150*b* formed of a polymer. In addition, the dam portions 170*a*, 170*b*, and 170*c* may serve to block penetration of moisture from the outside.

Accordingly, the primary protective layer 150*a* may be formed to extend to one end of the non-active area NA including upper portions of the dam portions 170*a*, 170*b*, and 170*c*, but the organic layer 150*b* may be formed before the dam portions 170*a*, 170*b*, and 170*c*, and the secondary protective layer 150*c* may cover and protect the organic layer 150*b*.

Meanwhile, although the trench pattern 140 is formed between the sub-pixels SP to prevent leakage current between the sub-pixels SP, since the primary protective layer 150*a* of the encapsulation layer 150 is not completely deposited in the trench pattern 140, a defect in the reliability evaluation occurs. That is, when the primary protective layer 150*a* of an inorganic layer is directly deposited on the trench pattern 140, it is deposited while a void is formed in a middle of the trench pattern 140, resulting in poor step coverage. In this case, the primary passivation layer 150*a* is not properly deposited, causing a defect in reliability. Also, due to this, display quality defects such as light and dark spots or bright spots occur.

In particular, the inorganic layer of the primary protective layer 150*a* is not deposited to completely cover foreign materials, thereby causing a film formation defect of the encapsulation layer 150. That is, the primary protective layer 150*a* does not completely cover an inversely tapered portion of the foreign material, so that a seam is formed in the inversely tapered portion.

Accordingly, the present disclosure is characterized in that, before film formation of the encapsulation layer 150, the buffer layer 155 is deposited in the trench pattern 140 by an initiated chemical vapor deposition (iCVD) method. The buffer layer 155 of the iCVD method may be deposited to cover an inner surface of the trench pattern 140, and if a thickness of the buffer layer 155 is sufficiently thin, the buffer layer 155 may be deposited along an inner shape of the trench pattern 140. However, the present disclosure is not limited thereto, and may be deposited to completely fill an inside of the trench pattern 140 according to deposition conditions.

In addition, the buffer layer 155 of the present disclosure may be deposited on the spacer 160 along a bending of the spacer 160.

The buffer layer 155 according to the first example embodiment of the present disclosure may have a thickness of 0.3 μm to 1.0 μm, and the primary protective layer 150*a*, the organic layer 150*b*, and the secondary protective layer 150*c* may have thicknesses of 0.3 μm to 1.0 μm, 1.0 μm to 11.0 μm and 0.3 μm to 1.0 μm, respectively.

In this case, the buffer layer 155 may have a refractive index of about 1.45 to 1.60, and the primary protective layer 150*a* and the second protective layer 150*c* may have a refractive index of about 1.4 to 1.9.

The buffer layer 155 may be formed to extend to the non-active area NA in the outer portion.

The buffer layer 155 that is formed to extend to the non-active area NA may be deposited on the plurality of dam portions 170*a*, 170*b*, and 170*c* along bendings of the plurality of dam portions 170*a*, 170*b*, and 170*c*.

In particular, since the buffer layer 155 that is formed by the iCVD method does not react with the inorganic layer of the primary protective layer 150*a* thereon, the primary protective layer 150*a* can be smoothly deposited.

The iCVD method is a method in which a chain polymerization reaction using free radicals, known as a liquid phase process is used. The iCVD method is a method of depositing a polymer thin film on a surface of a substrate by vaporizing an initiator and a monomer to cause a polymer reaction in a gas phase. At this time, when the initiator and the monomer are simply mixed, the polymerization reaction does not occur, but when the initiator is decomposed by a high-temperature filament located in a gas phase reactor to thereby generate radicals, monomers are activated accordingly, and the chain polymerization reaction can be performed.

Since the iCVD method generates a reaction using only monomers and radicals without an organic solvent or other additives, it is possible to produce a thin film of higher purity than a polymer synthesis method through an existing liquid phase process. That is, the iCVD method does not use an organic solvent and thus, there is no defect caused by various impurities. And, since the iCVD method is a dry process, deposition on various types of substrates is possible therein. In addition, since the iCVD method is carried out at room temperature, it is advantageous in that there is no damage to a light emitting element due to heat.

As described above, in the first example embodiment of the present disclosure, a film formation defect of the encapsulation layer 150 may be prevented by depositing the buffer layer 155 of the iCVD method under the primary protective layer 150*a* to cover the inner surface of the trench pattern 140. Accordingly, it is possible to improve reliability of the display device 100 and prevent display quality defects such as light and dark spots or bright spots, thereby improving display quality.

In addition, the buffer layer 155 of the iCVD method may be deposited in a conformal or flat manner according to process conditions, unlike the organic layer 150*b* of the inkjet method. In addition, the buffer layer 155 of the iCVD method may be deposited in a flowable manner (flowably deposited) according to process conditions.

FIG. 6 is a table showing process conditions of iCVD buffer layers.

FIGS. 7A to 7D are photographs showing surface characteristics of the iCVD buffer layers.

FIGS. 8A to 8D are other photographs showing surface characteristics of the iCVD buffer layers.

FIG. 6 is a table showing process conditions of iCVD buffer layers including types of initiators and monomers.

FIGS. 7A to 7D are scanning electron microscope (SEM) photographs showing surface characteristics of iCVD buffer layers deposited on a trench pattern having a depth of 1 μm, as examples.

FIGS. 8A to 8D are SEM photographs showing surface characteristics of iCVD buffer layers deposited on a trench pattern having a depth of 5 μm, as examples.

FIGS. 7A to 7D show cases where an aspect ratio of the trench pattern is 1:5, and FIGS. 8A to 8D show cases where an aspect ratio of the trench pattern is 5:5.

Figure 7A:
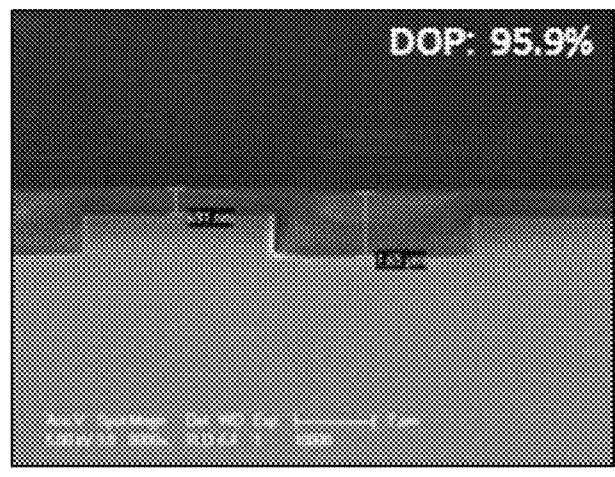
FIGS. 7A to 7D are photographs showing surface characteristics of the iCVD buffer layers.
Figure 7B:
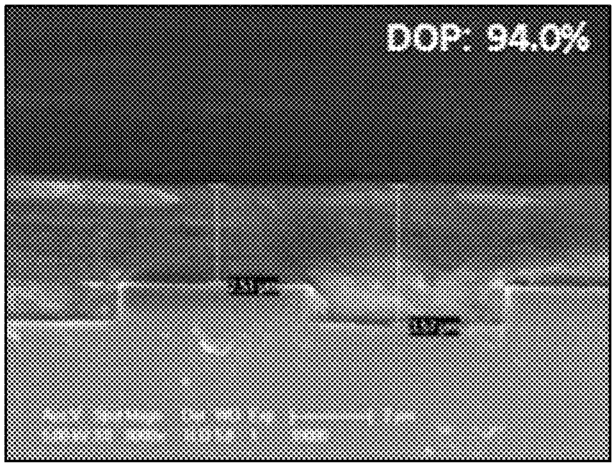
Figure 7C:
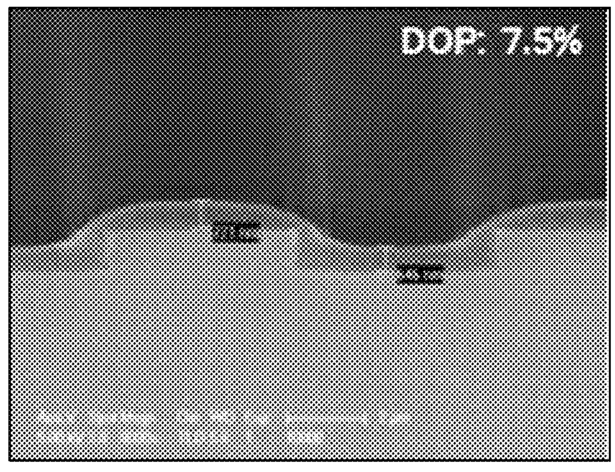
Figure 7D:
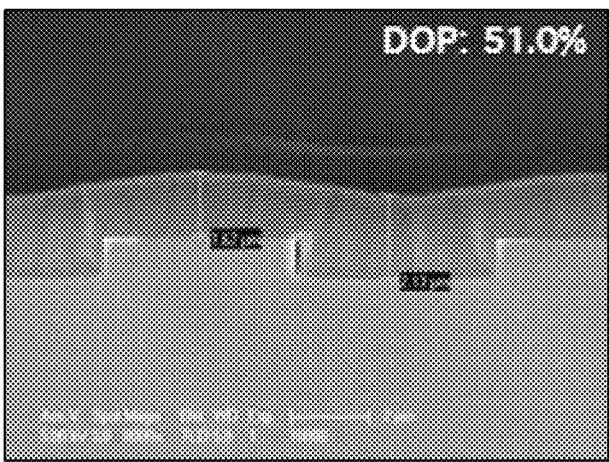
Figure 8A:
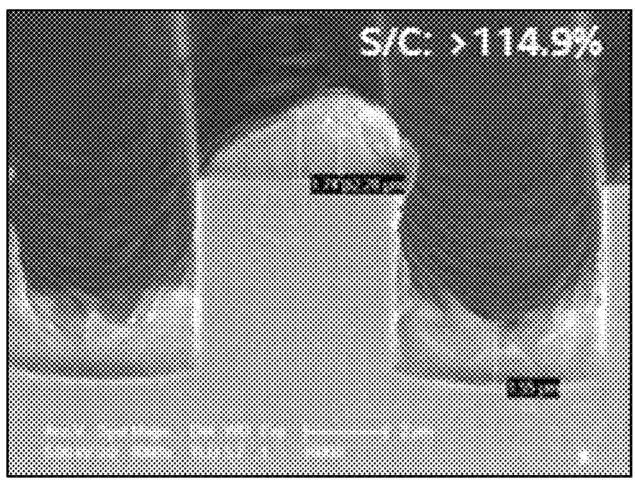
FIGS. 8A to 8D are other photographs showing surface characteristics of the iCVD buffer layers.
Figure 8B:
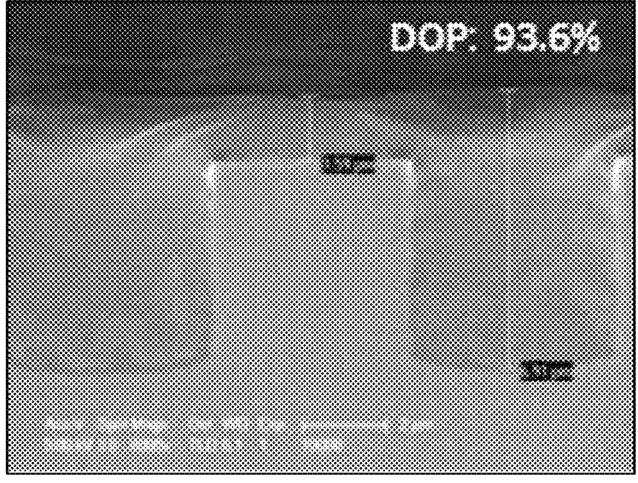
Figure 8C:
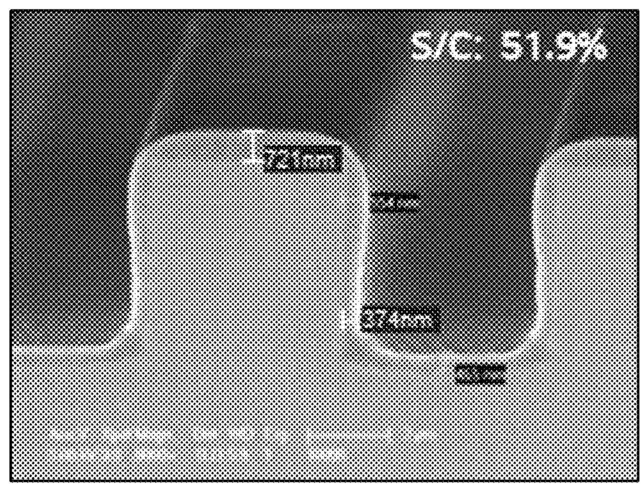
Figure 8D:
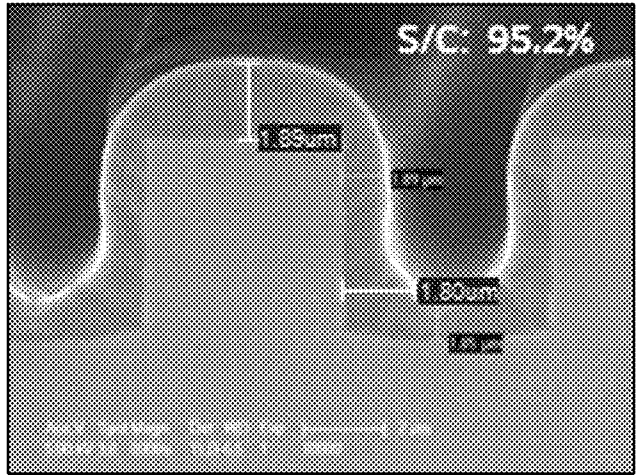

FIGS. 7A and 8A show surface characteristics of a buffer layer deposited according to #1 of FIG. 6, and FIGS. 7B and 8B show surface characteristics of a buffer layer deposited according to #2 of FIG. 6. FIGS. 7C and 8C show surface characteristics of a buffer layer deposited according to #3 of FIG. 6, and FIGS. 7D and 8D show surface characteristics of a buffer layer deposited according to #4 of FIG. 6

Referring to FIG. 6, for deposition of the iCVD buffer layer, for example, an initiator of tert-butyl peroxide (TBPO) was used while monomer 1 of glycidyl methacrylate (GMA) or monomer 2 of 2-hydroxyethyl acrylate (HEA) was used. However, the present disclosure is not limited thereto, and ethylene glycol diacrylate (EGDA) can be used as a monomer. The monomers used in the present disclosure includes styrene-based or siloxane-based monomers in addition to acrylic monomers. In this case, the iCVD buffer layer may have a refractive index of about 1.50 to 1.51 based on a thickness of 0.5 μm, and it can be seen that there is no significant change even when the thickness is increased. In addition, it can be seen that the iCVD buffer layer has a transmittance of about 100% in a visible ray region regardless of a material of the monomer, which is equivalent to the case of the buffer layer of the inkjet method.

While a flow rate of the monomer 1 was changed in a state in which conditions such as flow rates of the initiator and the monomer 2 and temperatures and pressures of the initiator and the monomers 1 and 2 were set identically, surface characteristics of the deposited iCVD buffer layers were observed.

At this time, the flow rates of the initiator and the monomer 2 were 30 sccm and 28 sccm, respectively, the temperatures of the initiator and the monomers 1 and 2 were 30° C., 30° C. and 45° C., respectively, and temperatures of a filament, a stage, and a chamber were 140° C., 30° C. and 70° C. respectively, and a pressure in the chamber could be 200 mTorr.

In this state, the flow rate of monomer 1 was changed to 45 sccm, 56 sccm, 84 sccm, and 112 sccm.

As a result, referring to FIGS. 7A to 7D and FIGS. 8A to 8D, in the cases of #1 and #2 in FIG. 6, it can be seen that flowable deposition was performed, and in the cases of #3 and #4, conformal deposition was performed. When the aspect ratio of the trench pattern is 1:5 in #1, it can be seen that the flowable deposition is performed as in FIG. 7A, but when the aspect ratio of the trench pattern is 5:5, it can be seen that a thin film fails to completely cover the trench pattern as in FIG. 8A. Whether the thin film is deposited in a conformal manner (conformally deposited) or is flowably deposited may be determined by a fraction of monomers. For example, when a fraction of the monomer 1 and the monomer 2 is about 1.6:1 to 2:1, the thin film may be flowably deposited, and when the fraction is about 3:1 to 4:1, the thin film could be conformally deposited, but the present disclosure is not limited thereto.

Here, the monomer 1 may be used as a main monomer and the monomer 2 may be used as a sub-monomer, but the present disclosure is not limited thereto, and the thin film can be conformally deposited or flowably deposited according to a fraction by copolymerization of two or more monomers.

Figure 9:
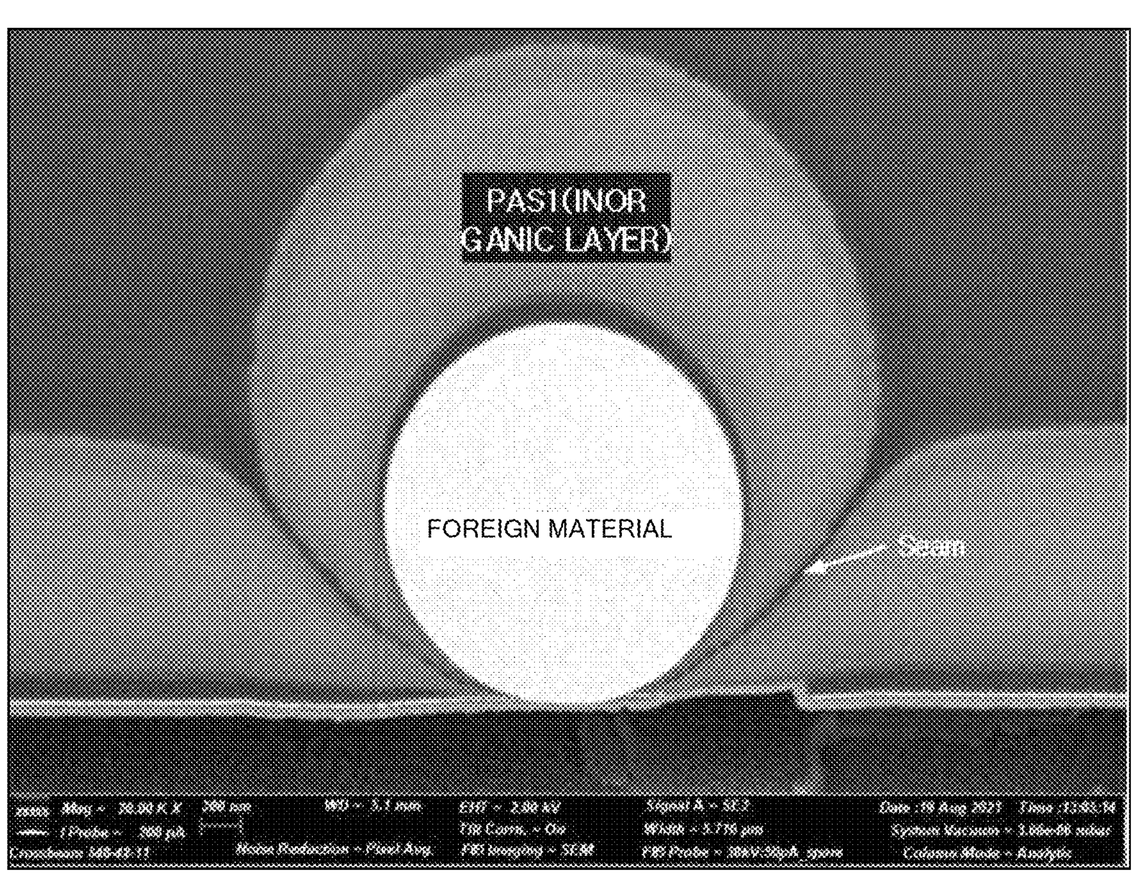
FIG. 9 is a photograph showing a film formation state of an encapsulation layer deposited on a foreign material.
Figure 10A:
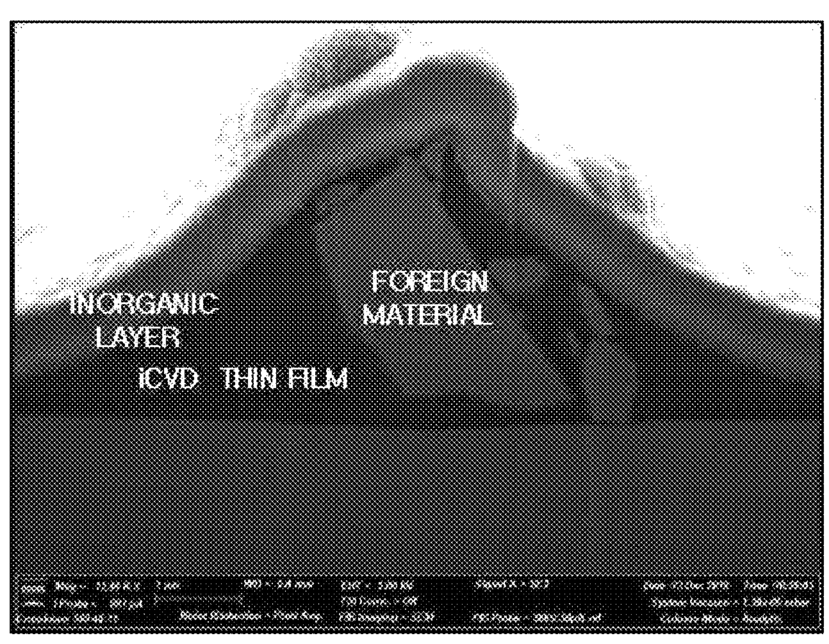
FIGS. 10A to 10D are photographs showing film formation states of iCVD buffer layers deposited on foreign materials.
Figure 10B:
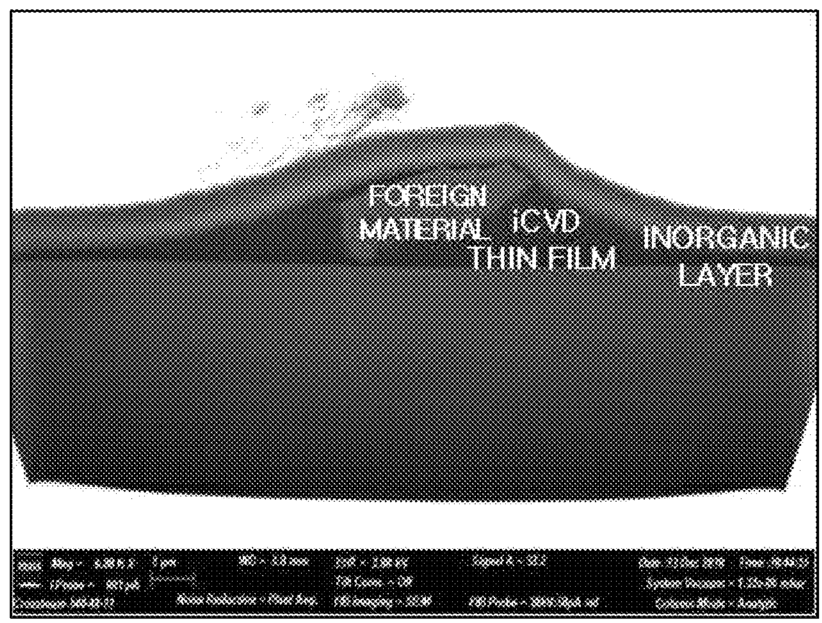
Figure 10C:
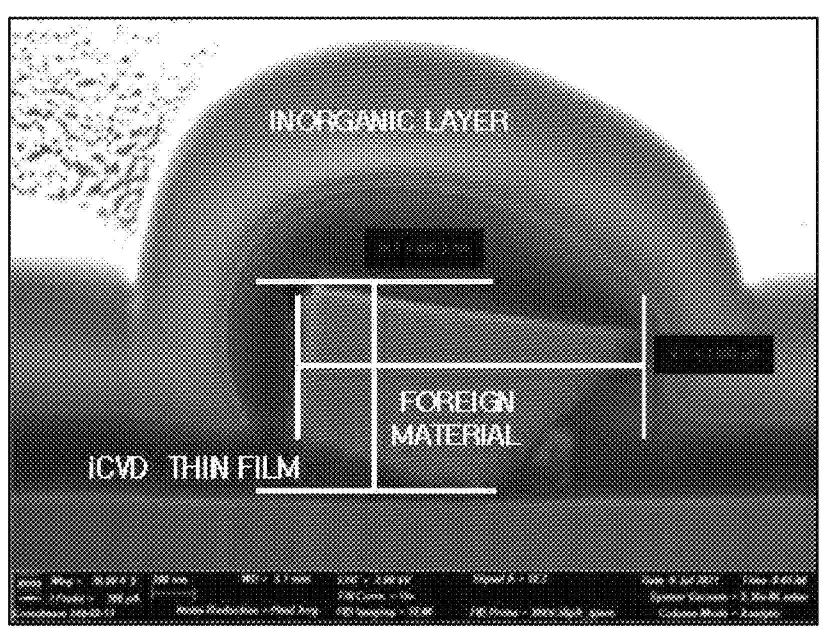
Figure 10D:
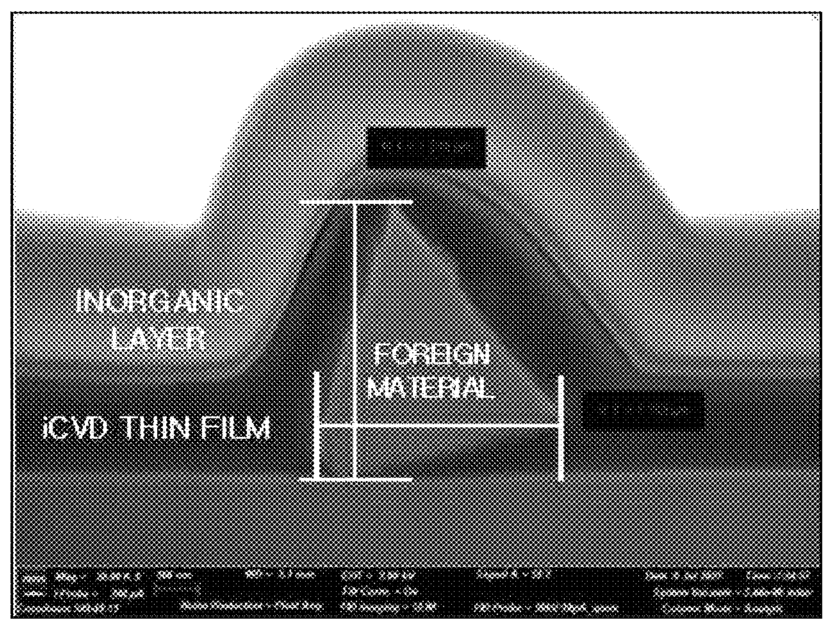

FIG. 9 is a photograph showing a film formation state of the encapsulation layer deposited on a foreign material.

FIGS. 10A to 10D are photographs showing film formation states of iCVD buffer layers deposited on foreign materials.

FIG. 9 is a case in which a primary protective layer of an inorganic layer is directly deposited on a substrate as in an existing case, and FIGS. 10A to 10D are cases in which primary protective layers are deposited after iCVD buffer layers are deposited on a substrate.

Referring to FIG. 9, it can be seen that the inorganic layer of the primary protective layer does not completely cover an inversely tapered portion of the foreign material, so that a seam is formed in the inversely tapered portion.

On the other hand, referring to FIGS. 10A to 10D, when the primary protective layer is deposited after the iCVD buffer layer is deposited on the substrate, it can be seen that the iCVD buffer layer and the inorganic layer are deposited to completely cover the inversely tapered portion of the foreign material regardless of a shape of the foreign material. As a result, it can be seen that the iCVD buffer layer could be deposited without a seam on the foreign material regardless of the shape of the foreign material. That is, the iCVD buffer layer can be deposited on the inversely tapered portion without a seam.

For reference, a possibility that a foreign material is formed on a capping layer. A process of components from a light emitting element to the capping layer can be carried out in one vacuum chamber, but a process of an encapsulation layer is carried out in another process chamber, so a possibility that a foreign material is formed on the capping layer may be high.

Meanwhile, the organic layer of the present disclosure can also be deposited by the iCVD method, which will be described in detail with reference to FIGS. 11 and 12 below.

Figure 11:
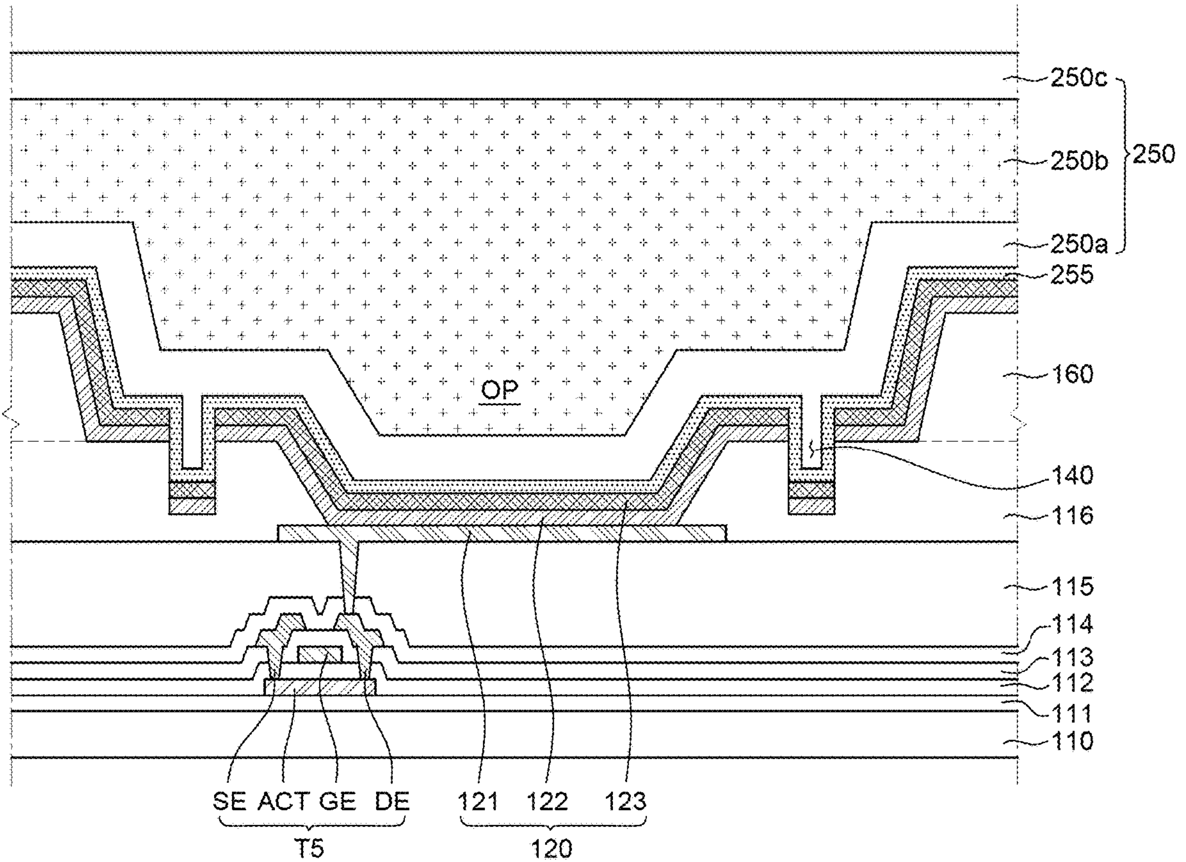
FIG. 11 is a cross-sectional view of a portion of a display device according to a second example embodiment of the present disclosure.

FIG. 11 is a cross-sectional view of a portion of a display device according to a second example embodiment of the present disclosure.

Figure 12:
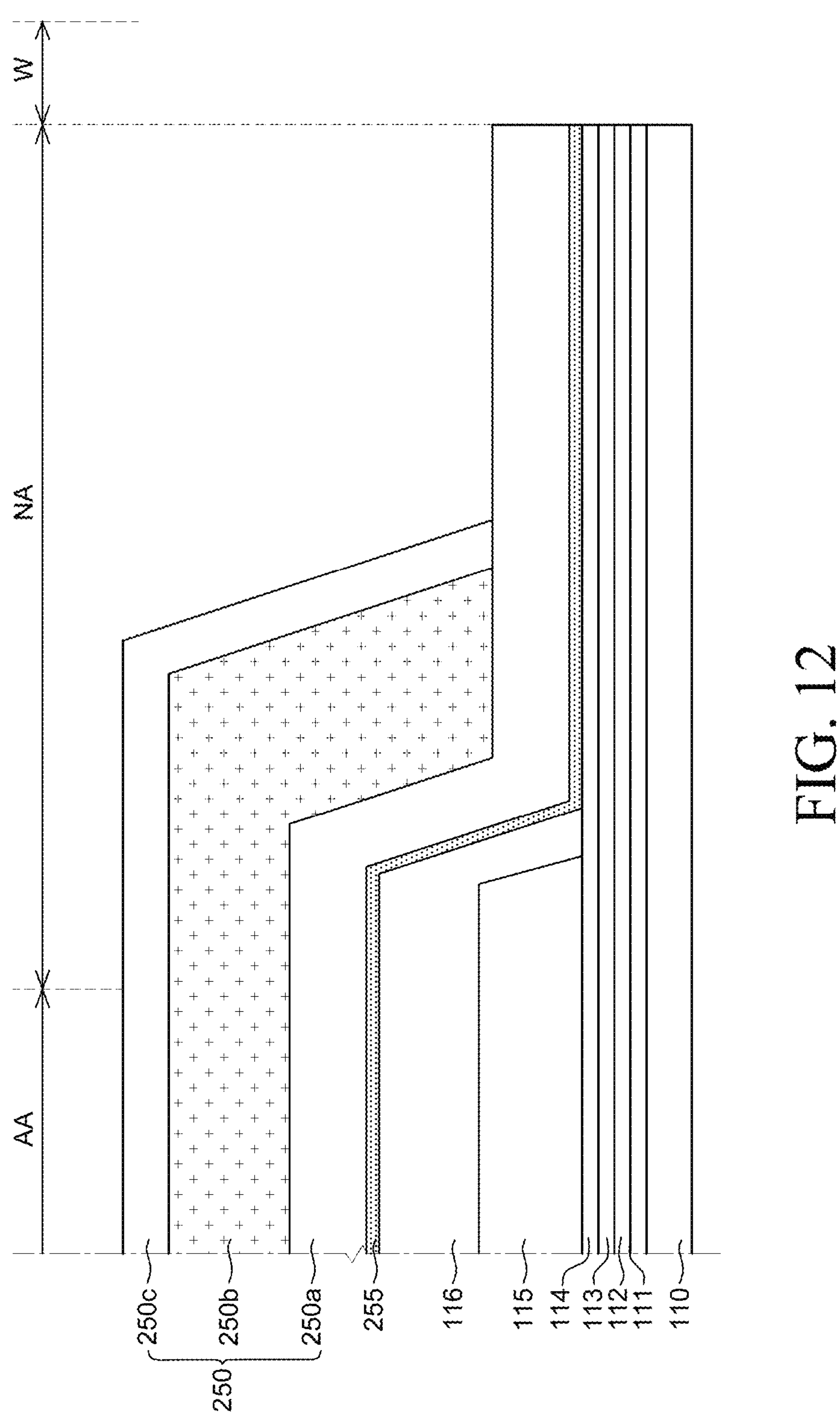
FIG. 12 is a cross-sectional view illustrating an outer portion of the display device of FIG. 11.

FIG. 12 is a cross-sectional view illustrating an outer portion of the display device of FIG. 11.

Since the display device of FIGS. 11 and 12 is different from the display device 100 of FIGS. 4 and 5 only in terms of a configuration of an organic layer 250*b* of an encapsulation layer 250 and other configurations thereof are substantially the same, redundant descriptions may be omitted. The same reference numerals are used for the same components.

Referring to FIGS. 11 and 12, the display device according to the second example embodiment of the present disclosure may include the substrate 110, the buffer layer 111, the gate insulating layer 112, the interlayer insulating layer 113, the passivation layer 114, the planarization layer 115, the banks 116, high potential power lines, scan lines, data lines, initialization signal lines, emission control signal lines, the fifth transistor T5, the light emitting elements 120, the spacers 160, a buffer layer 255, and the encapsulation layer 250, in substantially the same manner as the display device of FIGS. 4 and 5 described above.

FIG. 11 illustrates only the fifth transistor T5 among the plurality of transistors and capacitors of the pixel circuit of one sub-pixel for convenience of explanation.

The plurality of sub-pixels are individual units that emit light, and the light emitting element 120 may be disposed in each of the plurality of sub-pixels.

The plurality of spacers 160 may be disposed between the plurality of sub-pixels.

Also, the plurality of trench patterns 140 may be disposed between the plurality of sub-pixels. The plurality of trench patterns 140 may be formed by partially removing the thickness of the upper portion of the bank 116, but the present disclosure is not limited thereto, and the plurality of trench patterns 140 may be formed by removing the entire thickness of the bank 116.

A portion of the organic layers 122 and the cathodes 123 between adjacent sub-pixels may be disconnected by the trench pattern 140.

The trench pattern 140 may minimize a lateral leakage current generated in a multi-stack structure.

That is, the organic layer 122 and the cathode 123 may be disposed on the anode 121 and the bank 116. In this case, the organic layer 122 and the cathode 123 are formed on the bottom of the trench pattern 140, but are not formed on the side surface thereof, so that at least a portion of the organic layers 122 and the cathodes 123 between the adjacent sub-pixels may be disconnected. Accordingly, the leakage current flowing to the adjacent sub-pixels can be minimized.

Meanwhile, the buffer layer 111, the gate insulating layer 112, the interlayer insulating layer 113, and the passivation layer 114 may be formed to extend to the non-active area NA in the outer portion of the display device.

In addition, the planarization layer 115 and the bank 116 may be formed thereon up to a portion of the non-active area NA.

Although not shown, a capping layer formed of an organic material such as a polymer or the like may be formed on the substrate 110 on which the cathode 123 is formed.

The buffer layer 255 according to the present disclosure is formed on the capping layer, and the encapsulation layer 250 composed of multiple layers may be formed thereon.

The encapsulation layer 250 according to the present disclosure may be configured to include a primary protective layer 250*a* formed on the buffer layer 255, the organic layer 250*b* formed on the primary protective layer 250*a*, and a secondary protective layer 250*c* formed on the organic layer 250*b*, but is not limited thereto.

The primary protective layer 250*a* and the secondary protective layer 250*c* may be formed of an inorganic insulating layer, and the organic layer 250*b* may be formed of an organic insulating layer of the iCVD.

In this case, unlike the above-described first example embodiment of the present disclosure, there is no need to provide a plurality of dam portions in the non-active area NA in the outer portion, thereby providing an effect of reducing a bezel width. That is, the dam portion is a physical structure that prevents ink from spreading and spilling out when it is cured in an inkjet process, which is a liquid phase process. However, an iCVD process is a vapor deposition, there is no defect in which ink spreads and spills out. Accordingly, it is possible to remove the dam portion, and as a result, it provides an effect that the bezel width is reduced by W compared to the above-described first example embodiment.

Accordingly, the primary protective layer 250*a* is formed to extend to one end of the non-active area NA, while the organic layer 250*b* and the secondary protective layer 250*c* are formed to extend to only a portion of the non-active area NA, and the secondary protective layer 250*c* may cover and protect the organic layer 250*b*.

In addition, the inkjet method, which is a wet process, is difficult to achieve a thickness of 1 μm or less even in the case of using a high-resolution head and a low-viscosity material. However, in the iCVD process, since a thickness can be controlled by deposition time through a dry process, a thickness of 1 μm or less can be implemented, and a thickness of about 1 μm can be stably implemented.

Accordingly, a thickness of the encapsulation layer 250 can be reduced even in the active area AA, thereby achieving effects of reducing the amount of light totally reflected within the device and improving color viewing angle and preventing color mixing in a high-resolution panel. That is, in a high-resolution panel, a pitch of pixels, that is, a distance between pixels, is reduced, but when an encapsulation layer having an existing thickness is used, a light path may invade adjacent pixels, resulting in color mixing or a reduced color viewing angle.

Meanwhile, as described above, the present disclosure is characterized in that the buffer layer 255 is deposited in the trench pattern 140 by the iCVD method before a film formation of the encapsulation layer 250. The buffer layer 255 of the iCVD method may be conformally deposited to cover the inner surface of the trench pattern 140, or may be deposited to completely fill the inside of the trench pattern 140 according to deposition conditions.

In addition, the buffer layer 255 of the present disclosure may be deposited on the spacer 160 along the bending of the spacer 160.

The buffer layer 255 may be formed to extend to one end of the non-active area NA in the outer portion.

The primary protective layer 250*a* may be deposited on the buffer layer 255 formed to extend to the non-active area NA.

In particular, the buffer layer 255 formed by the iCVD method does not react with the inorganic layer of the primary protective layer 250*a* thereon, so that the primary protective layer 250*a* can be smoothly deposited.

The buffer layer 255 according to the second example embodiment of the present disclosure may have a thickness of 0.3 μm to 1.0 μm, and the primary protective layer 250*a*, the organic layer 250*b*, and the secondary protective layer 250*c* may have thicknesses of 0.3 μm to 1.0 μm, 0.3 μm to 1.5 μm and 0.3 μm to 1.0 μm, respectively. In this case, it can be seen that an entire thickness is 1.2 μm to 4.5 μm, which is reduced compared to 1.9 μm to 14.0 μm of the first example embodiment of the present disclosure, described above.

In this case, the buffer layer 255 may have a refractive index of about 1.45 to 1.60, and the primary protective layer 250*a* and the secondary protective layer 250*c* may have a refractive index of about 1.4 to 1.9.

As described above, in the second example embodiment of the present disclosure, a film formation defect of the encapsulation layer 250 may be prevented by depositing the buffer layer 255 under the primary protective layer 250*a* by the iCVD method to cover an inner surface of the trench pattern 240.

In addition, the second example embodiment of the present disclosure is characterized in that even if a foreign material is generated during a process, the buffer layer 255 of the iCVD method is deposited so as to completely cover an inversely tapered portion of the foreign material. Accordingly, the buffer layer 255 and the primary protective layer 250*a* may be deposited on the foreign material without a seam.

On the other hand, the iCVD buffer layer of the present disclosure may be flowably deposited to completely cover the trench pattern including the inside of the trench pattern, which will be described in detail with reference to FIG. 13 below.

Figure 13:
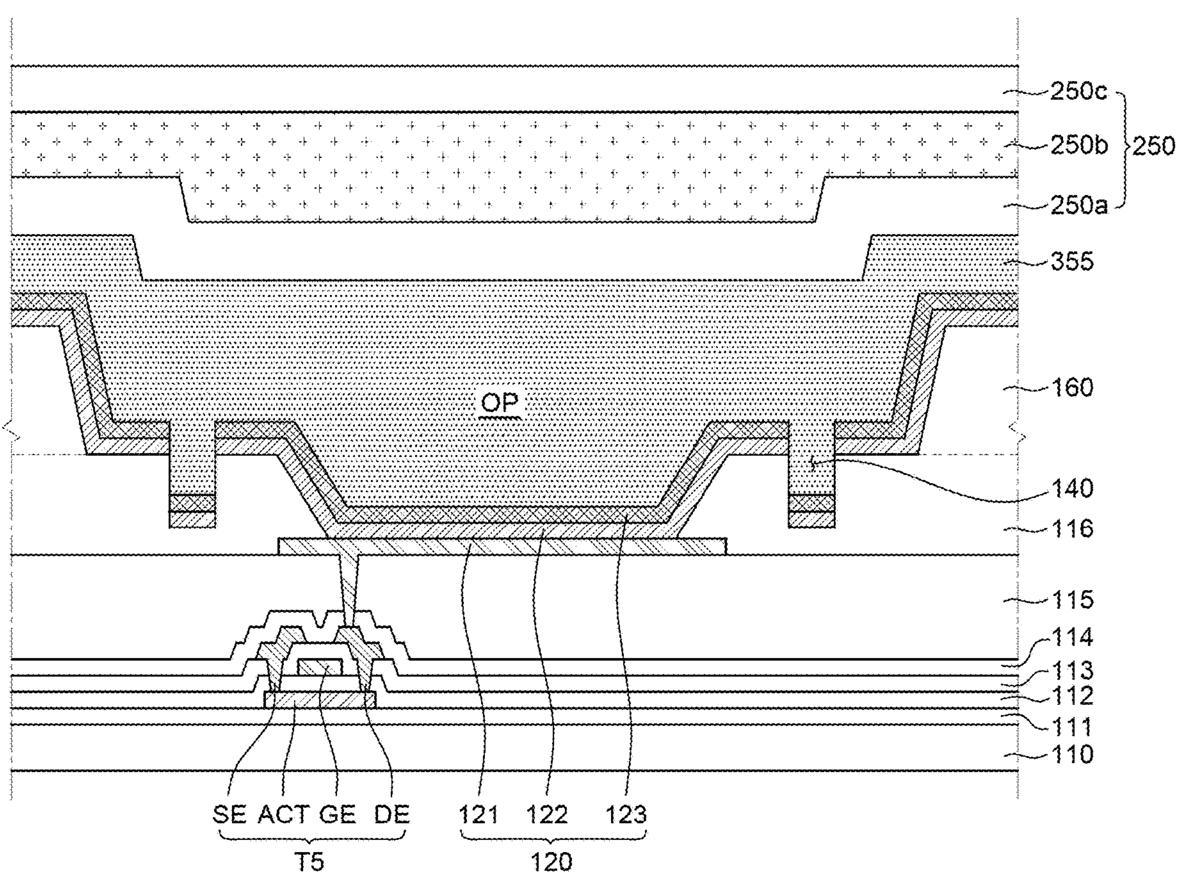
FIG. 13 is a cross-sectional view of a portion of a display device according to a third example embodiment of the present disclosure.

FIG. 13 is a cross-sectional view of a portion of a display device according to a third example embodiment of the present disclosure.

The display device according to the third example embodiment of the present disclosure of FIG. 13 is different from the display device of FIG. 11 in that an iCVD buffer layer 355 is flowably deposited, and other configurations thereof are substantially the same. Thus, redundant descriptions will be omitted. The same reference numerals are used for the same components.

Referring to FIG. 13, the display device according to the third example embodiment may include the substrate 110, the buffer layer 111, the gate insulating layer 112, the interlayer insulating layer 113, the passivation layer 114, the planarization layer 115, the banks 116, high potential power lines, scan lines, data lines, initialization signal lines, emission control signal lines, the fifth transistor T5, the light emitting elements 120, the spacers 160, the buffer layer 355, and the encapsulation layer 250, in substantially the same manner as the display device of FIG. 11 described above.

FIG. 13 illustrates only the fifth transistor T5 among the plurality of transistors and capacitors of the pixel circuit of one sub-pixel for convenience of explanation.

The plurality of sub-pixels are individual units that emit light, and the light emitting element 120 may be disposed in each of the plurality of sub-pixels.

The plurality of spacers 160 may be disposed between the plurality of sub-pixels.

Also, the plurality of trench patterns 140 may be disposed between the plurality of sub-pixels.

A portion of the organic layers 122 and the cathodes 123 between the adjacent sub-pixels may be disconnected by the trench pattern 140.

The trench pattern 140 may minimize a lateral leakage current generated in a multi-stack structure.

Although not shown, a capping layer formed of an organic material such as a polymer or the like may be formed on the substrate 110 on which the cathode 123 is formed.

The buffer layer 355 according to the present disclosure is formed on the capping layer, and the encapsulation layer 250 composed of multiple layers may be formed thereon.

The encapsulation layer 250 according to the present disclosure may include a primary protective layer 250*a* formed on the buffer layer 355, an organic layer 250*b* formed on the primary protective layer 250*a*, and a secondary protective layer 250*c* formed on the organic layer 250*b*, but is not limited thereto.

The primary protective layer 250*a* and the secondary protective layer 250*c* may be formed of an inorganic insulating layer, and the organic layer 250*b* may be formed of an organic insulating layer of the iCVD.

In this case, as in the second example embodiment of the present disclosure described above, there is no need to provide a plurality of dam portions in the non-active area NA in the outer portion, thereby providing an effect of reducing a bezel width.

The buffer layer 355 according to the third example embodiment of the present disclosure may have a thickness of 0.3 μm to 5.0 and the primary protective layer 250*a*, the organic layer 250*b*, and the secondary protective layer 250*c* may have thicknesses of 0.3 μm to 1.0 μm, 0.3 μm to 1.5 and 0.3 μm to 1.0 respectively. In this case, it can be seen that an entire thickness is 1.2 μm to 8.5 which is reduced compared to 1.9 μm to 14.0 μm of the first example embodiment of the present disclosure. Compared to the second example embodiment, only the thickness of the buffer layer 355 is different, but the thickness of the encapsulation layer 250 may be the same.

In this case, the buffer layer 355 may have a refractive index of about 1.45 to 1.60, and the primary protective layer 250*a* and the secondary protective layer 250*c* may have a refractive index of about 1.4 to 1.9.

Meanwhile, the third example embodiment of the present disclosure is characterized in that, before the film formation of the encapsulation layer 250, the buffer layer 355 is flowably deposited to completely cover the trench pattern 140 including the inside of the trench pattern 140 by the iCVD method.

The buffer layer 355 may be formed to extend to one end of the non-active area of the outer portion.

The primary protective layer 250*a* may be deposited on the buffer layer 355 that is formed to extend to the non-active area.

In particular, the buffer layer 355 that is formed by the iCVD method does not react with the inorganic layer of the primary protective layer 250*a* thereon, and is flowably deposited to completely cover the trench pattern 140, so that the primary protective layer 250*a* can be smoothly deposited. As a result, it is possible to prevent film formation defects of the encapsulation layer 250.

In addition, even if a foreign material is generated during a process, the buffer layer 355 of the iCVD method is flowably deposited so as to completely cover the trench pattern 140 as well as the foreign material, so that the buffer layer 355 and the primary protective layer 250*a* can be deposited without a seam. In addition, as the buffer layer 355 is flowably deposited, a step of the device may be alleviated. Accordingly, as the encapsulation layer 250 is formed over the alleviated step of the device, the thickness thereof can be formed thinner and it is advantageous in enhancing a pure encapsulation function.

Meanwhile, the present disclosure is applicable even in case where the spacer is formed in an inversely tapered shape, which will be described in detail with reference to the following FIGS. 14 to 16.

Figure 14:
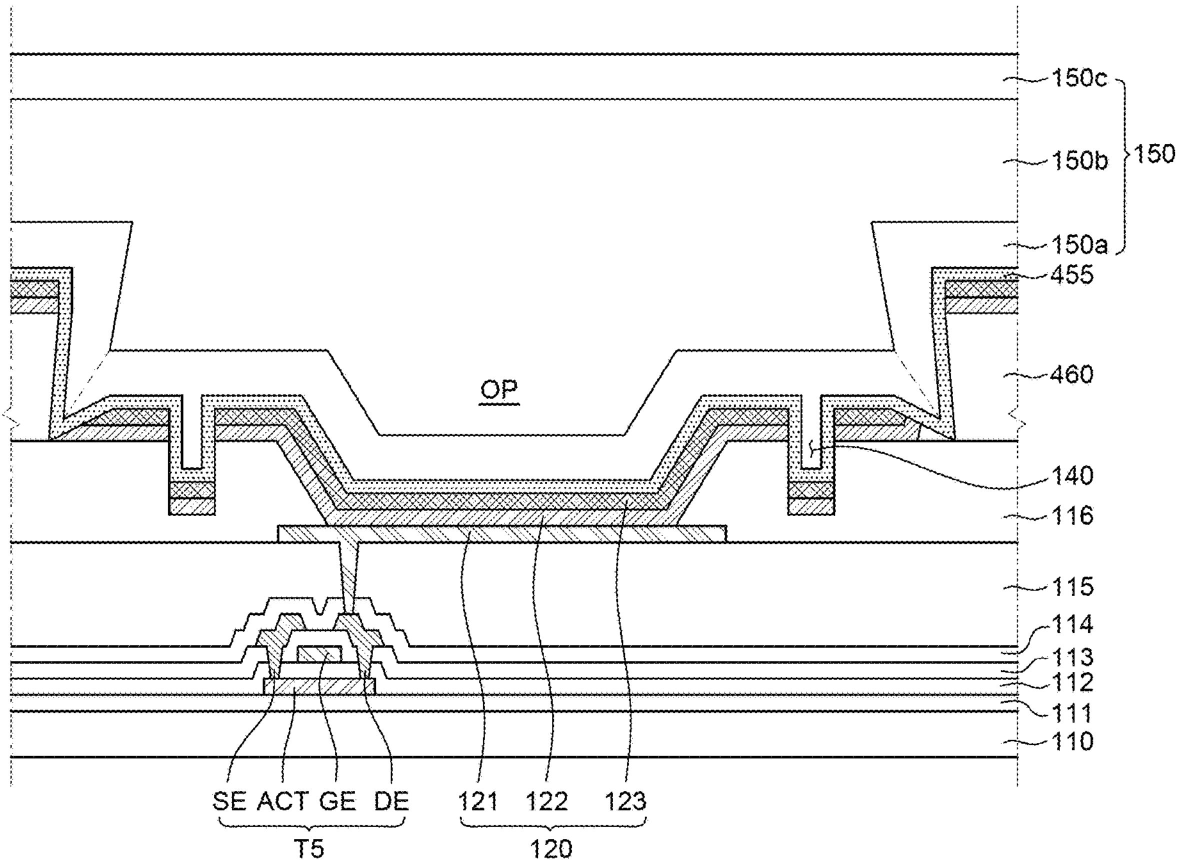
FIG. 14 is a cross-sectional view of a portion of a display device according to a fourth example embodiment of the present disclosure.

FIG. 14 is a cross-sectional view of a portion of a display device according to a fourth example embodiment of the present disclosure.

Figure 15:
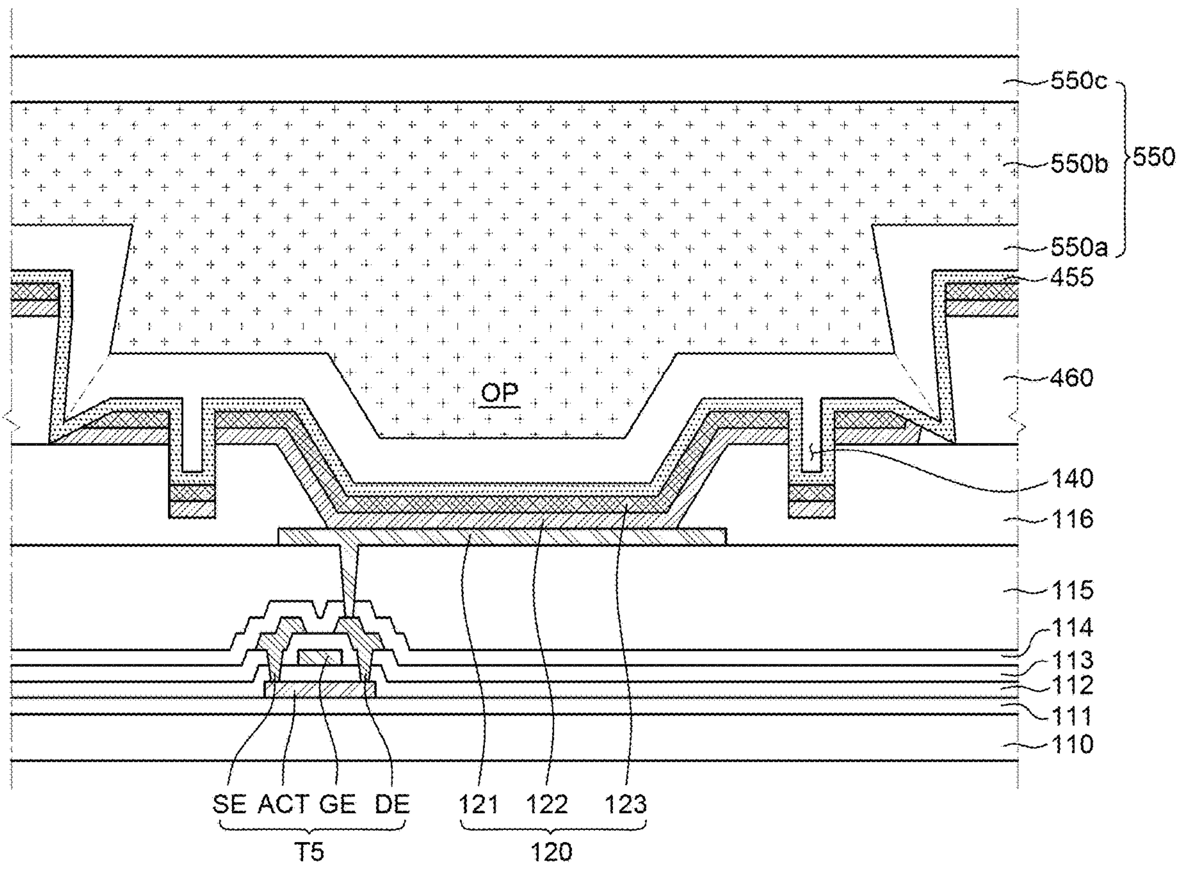
FIG. 15 is a cross-sectional view of a portion of a display device according to a fifth example embodiment of the present disclosure.

FIG. 15 is a cross-sectional view of a portion of a display device according to a fifth example embodiment of the present disclosure.

Figure 16:
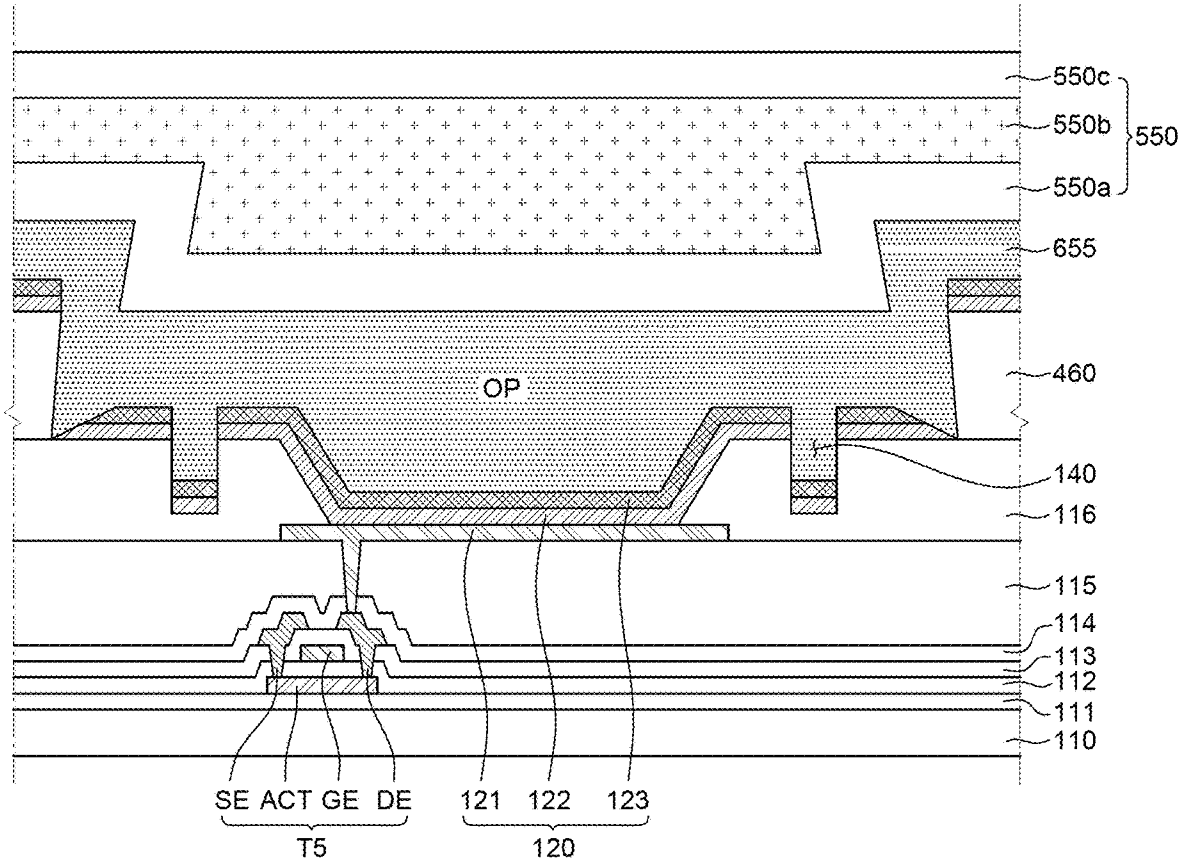
FIG. 16 is a cross-sectional view of a portion of a display device according to a sixth example embodiment of the present disclosure.

FIG. 16 is a cross-sectional view of a portion of a display device according to a sixth example embodiment of the present disclosure.

Display devices of the fourth, fifth, and sixth example embodiments of the present disclosure shown in FIGS. 14 to 16 are respectively different from the display devices of the first, second, and third example embodiments of the present disclosure in that a spacer 460 is formed in an inversely tapered shape, and other configurations thereof are substantially the same. Thus, redundant descriptions may be omitted. The same reference numerals are used for the same components.

Referring to FIGS. 14 to 16, the display devices according to the fourth, fifth, and sixth example embodiments of the present disclosure may include the substrate 110, the buffer layer 111, the gate insulating layer 112, the interlayer insulating layer 113, the passivation layer 114, the planarization layer 115, the banks 116, high potential power lines, scan lines, data lines, initialization signal lines, emission control signal lines, the fifth transistor T5, the light emitting elements 120, the spacers 460, buffer layers 455 and 655, and encapsulation layers 150 and 550, in substantially the same manner as the display devices of the first, second, and third example embodiments of the present disclosure described above.

In FIGS. 14 to 16, only the fifth transistor T5 among the plurality of transistors and capacitors of the pixel circuit of one sub-pixel is illustrated for convenience of explanation.

The plurality of sub-pixels are individual units that emit light, and the light emitting element 120 may be disposed in each of the plurality of sub-pixels.

A plurality of the spacers 460 may be disposed between the plurality of sub-pixels. The spacer 460 of the fourth, fifth and sixth example embodiments of the present disclosure is characterized in that it has an inversely tapered shape. That is, it is characterized in that a width of a base side of the spacer 460 is shorter than a width of an upper side thereof Also, the plurality of trench patterns 140 may be disposed between the plurality of sub-pixels.

A portion of the organic layers 122 and the cathodes 123 between the adjacent sub-pixels may be disconnected by the trench pattern 140.

The trench pattern 140 may minimize a lateral leakage current generated in a multi-stack structure.

Although not shown, a capping layer formed of an organic material such as a polymer or the like may be formed on the substrate 110 on which the cathode 123 is formed.

The buffer layers 455 and 655 according to the present disclosure are formed on the capping layer, and the encapsulation layers 150 and 550 formed of multiple layers may be formed thereon.

The encapsulation layers 150 and 550 according to the present disclosure may be configured to include primary protective layers 150*a* and 550*a* formed on the buffer layers 455 and 655, organic layers 150*b* and 550*b* formed on the primary protective layers 150*a* and 550*a*, and secondary protective layers 150*c* and 550*c* formed on the organic layers 150*b* and 550*b*.

In this case, the primary protective layers 150*a* and 550*a* and the secondary protective layers 150*b* and 550*b* may be formed of an inorganic insulating layer. In addition, the organic layer 150*b* of the fourth example embodiment may be formed of an organic insulating layer that is formed by the inkjet method (organic insulating layer of the inkjet method), and the organic layer 550*b* of the fifth and sixth example embodiments may be formed of an organic insulating layer that is formed by the iCVD (organic insulating layer of the iCVD).

When the organic layer 550*b* is formed of the organic insulating layer of the iCVD, as in the second and third example embodiments of the present disclosure, there is no need to provide a plurality of dam portions in the non-active area of the outer portion, thereby providing an effect of reducing a bezel width.

Meanwhile, the fourth, fifth and sixth example embodiments of the present disclosure are characterized in that before film formation of the encapsulation layers 150 and 550, the buffer layers 455 and 655 are deposited by the iCVD method.

At this time, the buffer layer 455 according to the fourth and fifth example embodiments of the present disclosure may be conformally deposited to cover the inner surface of the trench pattern 140, and if the thickness of the buffer layer 455 is sufficiently thin, the buffer layer 455 may be deposited along the inner shape of the trench pattern 140. However, in this case, the primary protective layers 150*a* and 550*a* deposited thereon do not completely cover an inversely tapered portion of the spacer 460, so that a seam (shown by dotted lines in FIGS. 14 and 15) may be formed in the reversed tapered portion. However, even in this case, the buffer layer 455 may be deposited to completely cover the inversely tapered portion of the spacer 460 so that no seam is formed in the inversely tapered portion.

Meanwhile, the buffer layer 655 according to the sixth example embodiment may be flowably deposited to completely cover the trench pattern 140 including the inside of the trench pattern 140. In this case, as the buffer layer 655 is deposited to cover the inversely tapered portion of the spacer 460 with a sufficient thickness, the primary protective layer 550*a* may be deposited thereon without a seam being formed. The buffer layers 455 and 655 may be formed to extend to one end of the non-active area in the outer portion.

The primary protective layers 150*a* and 550*a* may be deposited on the buffer layers 455 and 655 that are formed to extend to the non-active area.

In particular, the buffer layers 455 and 655 that are formed by the iCVD method do not react with the inorganic layer of the primary protective layers 150*a* and 550*a* thereon, and are deposited to cover the inner surface of the trench pattern 140 or completely cover the trench pattern 140, so that the primary protective layers 150*a* and 550*a* may be smoothly deposited. As a result, it is possible to prevent film formation defects of the encapsulation layers 150 and 550.

Also, it is characterized in that even if foreign materials are generated during a process, the buffer layers 455 and 655 of the iCVD method are deposited to completely cover inversely tapered portions of the foreign materials. Accordingly, the buffer layers 455 and 655 and the primary protective layers 150*a* and 550*a* may be deposited on the foreign materials without a seam.

The example embodiments of the present disclosure can also be described as follows:

According to an aspect of the present disclosure, there is provided a display device. The display device includes a substrate having a plurality of sub-pixels defined thereon, a bank disposed between the plurality of sub-pixels, at least one trench pattern disposed between the plurality of sub-pixels and from which a thickness of an upper surface of the bank is partially removed, a buffer layer on the bank, the buffer layer being deposited to cover an inner surface of the trench pattern by an initiated chemical vapor deposition (iCVD) method and an encapsulation layer disposed on the buffer layer.

The display device may further include an anode disposed in each of the plurality of sub-pixels, an organic layer disposed on the anode and a cathode disposed on the organic layer, wherein the organic layer and the cathodes may be disconnected in the trench pattern between the sub-pixels adjacent to each other.

The buffer layer may be configured by copolymerization of an initiator and at least two acrylic monomers.

The initiator may include tert-butyl peroxide (TBPO), the monomers may include a monomer 1 of glycidyl methacrylate (GMA) and a monomer 2 of 2-hydroxyethyl acrylic acid (HEA), and the trench pattern may be conformally or flowably deposited according to a fraction of the monomer 1 and the monomer 2.

The fraction of the monomer 1 and the monomer 2 may be set to 1.6:1 to 2:1, and the buffer layer may be conformally deposited to cover an inner surface of the trench pattern along an inner shape of the trench pattern.

The fraction of the monomer 1 and the monomer 2 may be set to 3:1 to 4:1, and the buffer layer may be flowably deposited to cover an upper portion of the trench pattern, including an inside of the trench pattern.

When a foreign material may be disposed on the bank, the buffer layer may be deposited to completely cover an inversely tapered portion of the foreign material without a seam.

The encapsulation layer may include a primary protective layer disposed on the buffer layer, an organic layer disposed on the primary protective layer and secondary protective layer disposed on the organic layer, wherein the buffer layer may be disposed to extend to a non-active area of the substrate.

The display device may further include a plurality of dam portions disposed in the non-active area, wherein the organic layer may be disposed to extend to a front of the plurality of dam portions.

The buffer layer may be deposited on the plurality of dam portions along bending of the plurality of dam portions.

The organic layer may be deposited on the primary protective layer by the iCVD method, and the organic layer may extend to a portion of the non-active area.

A dam portion may do not exist outside the organic layer extending to the portion of the non-active area.

The display device may further include at least one spacer disposed on the bank between the plurality of sub-pixels.

The buffer layer may be deposited on the spacer along a bending of the spacer.

The spacer may have an inversely tapered shape, and the buffer layer may be deposited to completely cover an inversely tapered portion of the spacer so that a seam may be not formed.

The primary protective layer deposited on the buffer layer may have a seam in the inversely tapered portion of the spacer.

When the buffer layer may be flowably deposited, the primary protective layer may be deposited on the buffer layer so as not to have a seam in the inversely tapered portion of the spacer.

According to another aspect of the present disclosure, there is provided a display device. The display device includes a substrate having a plurality of sub-pixels defined thereon, a bank disposed between the plurality of sub-pixels, at least one trench pattern disposed between the plurality of sub-pixels and from which a thickness of an upper surface of the bank is partially removed, at least one spacer disposed on the bank between the plurality of sub-pixels, a buffer layer deposited on an inner surface of the trench pattern and the bank and the spacer along an inner shape of the trench pattern and a bending of the spacer by an iCVD method and an encapsulation layer disposed on the buffer layer.

When a foreign material may be disposed on the bank, the buffer layer maybe deposited to completely cover an inversely tapered portion of the foreign material without a seam.

The spacer may have an inversely tapered shape, and the buffer layer may be deposited to completely cover the inversely tapered portion of the spacer so that a seam may be not formed.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:

a substrate having a plurality of sub-pixels defined thereon;

a bank disposed between the plurality of sub-pixels;

at least one trench pattern disposed between the plurality of sub-pixels and from which a thickness of an upper surface of the bank is partially removed;

a buffer layer on the bank, the buffer layer being deposited to cover an inner surface of the trench pattern by an initiated chemical vapor deposition (iCVD) method; and an encapsulation layer disposed on the buffer layer, wherein each trench pattern extends along and surrounds at least two sides of a corresponding sub-pixel.

2. The display device of claim 1, further comprising:

an anode disposed in each of the plurality of sub-pixels;

an organic layer disposed on the anode; and a cathode disposed on the organic layer, wherein the organic layer and the cathode are disconnected in the trench pattern between the sub-pixels adjacent to each other.

3. The display device of claim 1, wherein the buffer layer is configured by copolymerization of an initiator and at least two acrylic monomers.

4. The display device of claim 3, wherein:

the initiator includes tert-butyl peroxide (TBPO), and the monomers include a monomer 1 of glycidyl methacrylate (GMA) and a monomer 2 of 2-hydroxyethyl acrylic acid (HEA).

5. The display device of claim 4, wherein:

the fraction of the monomer 1 and the monomer 2 is set to 1.6:1 to 2:1; and the buffer layer is conformally deposited to cover an inner surface of the trench pattern along an inner shape of the trench pattern.

6. The display device of claim 4, wherein;

the fraction of the monomer 1 and the monomer 2 is set to 3:1 to 4:1; and the buffer layer is flowably deposited to cover an upper portion of the trench pattern, including an inside of the trench pattern.

7. The display device of claim 1, wherein when a foreign material is disposed on the bank, the buffer layer is deposited to completely cover an inversely tapered portion of the foreign material without a seam.

8. The display device of claim 1, wherein the encapsulation layer includes:

a primary protective layer disposed on the buffer layer;

an organic layer disposed on the primary protective layer; and a secondary protective layer disposed on the organic layer, wherein the buffer layer is disposed to extend to a non-active area of the substrate.

9. The display device of claim 8, further comprising:

a plurality of dam portions disposed in the non-active area, wherein the organic layer is disposed to extend to a front of the plurality of dam portions.

10. The display device of claim 9, wherein the buffer layer is deposited on the plurality of dam portions along bending of the plurality of dam portions.

11. The display device of claim 8, wherein;

the organic layer is deposited on the primary protective layer by the iCVD method; and the organic layer extends to a portion of the non-active area.

12. The display device of claim 11, wherein a dam portion does not exist outside the organic layer extending to the portion of the non-active area.

13. The display device of claim 1, further comprising:

at least one spacer disposed on the bank between the plurality of sub-pixels.

14. The display device of claim 13, wherein the buffer layer is deposited on the spacer along a bending of the spacer.

15. The display device of claim 13, wherein;

the spacer has an inversely tapered shape; and the buffer layer is deposited to completely cover an inversely tapered portion of the spacer so that a seam is not formed.

16. The display device of claim 15, wherein the primary protective layer deposited on the buffer layer has a seam in the inversely tapered portion of the spacer.

17. The display device of claim 15, wherein when the buffer layer is flowably deposited, the primary protective layer is deposited on the buffer layer so as not to have a seam in the inversely tapered portion of the spacer.

18. A display device, comprising:

a plurality of sub-pixels disposed above a substrate;

a bank disposed above the substrate;

at least one trench pattern formed in the bank and between the plurality of sub-pixels;

a buffer layer formed within the at least one trench pattern via application of an initiated chemical vapor deposition (iCVD) method; and an encapsulation layer disposed above the buffer layer, wherein each trench pattern extends along and surrounds at least two sides of a corresponding sub-pixel.

19. The display device of claim 18, wherein the buffer layer is conformally deposited within the at least one trench pattern.

20. The display device of claim 18, wherein: the buffer layer covers an inner surface of the at least one trench pattern.

21. The display device of claim 18, wherein: the at least one trench pattern corresponds with a partial removal of a portion of the bank.

22. The display device of claim 18, further comprising:

an organic layer disposed within the at least one trench pattern, the buffer layer is disposed above the organic layer.

23. The display device of claim 18, further comprising:

an organic layer disposed above the bank, a first portion of the organic layer formed within the at least one trench pattern is disconnected from a second portion of the organic layer formed on an upper surface of the bank.

24. The display device of claim 18, further comprising:

an anode disposed above the substrate;

an organic layer disposed above the anode; and a cathode layer disposed above the organic layer, the buffer layer disposed above the cathode layer, a first portion of the organic layer formed within the at least one trench pattern is disconnected from a second portion of the organic layer formed above the anode, a first portion of the cathode layer formed within the at least one trench pattern is disconnected from a second portion of the cathode layer formed above the anode.

* * * * *